(12) United States Patent
Lindfors et al.

(10) Patent No.: US 7,601,223 B2
(45) Date of Patent: *Oct. 13, 2009

(54) SHOWERHEAD ASSEMBLY AND ALD METHODS

(75) Inventors: Sven Lindfors, Espoo (FI); Pekka Juha Soininen, Espoo (FI)

(73) Assignee: ASM International N.V., Bilthoven (NL)

( * ) Notice: Subject to any disclaimer, the term of this patent is extended or adjusted under 35 U.S.C. 154(b) by 843 days.

This patent is subject to a terminal disclaimer.

(21) Appl. No.: 10/782,727

(22) Filed: Feb. 18, 2004

(65) Prior Publication Data

US 2004/0216668 A1    Nov. 4, 2004

Related U.S. Application Data

(63) Continuation-in-part of application No. 10/428,207, filed on Apr. 29, 2003, now Pat. No. 7,537,662.

(51) Int. Cl.
*C23C 16/455* (2006.01)
*C23F 1/00* (2006.01)
*H01L 21/306* (2006.01)
*C23C 16/06* (2006.01)
*C23C 16/22* (2006.01)

(52) U.S. Cl. ................................. 118/715; 156/345.1
(58) Field of Classification Search ............... 118/715
See application file for complete search history.

(56) References Cited

U.S. PATENT DOCUMENTS 3,854,443 A    12/1974    Baerg .................... 118/724

(Continued)

FOREIGN PATENT DOCUMENTS

EP    0 015 390 B1    9/1985

(Continued)

OTHER PUBLICATIONS de Keijser et al., "Atomic layer epitaxy of gallium arsenide with the use of atomic hydrogen," *Appl. Phys. Lett.*, vol. 58, No. 11, Mar. 18, 1991, pp. 1187-1189.

(Continued)

*Primary Examiner*—Rudy Zervigon
(74) *Attorney, Agent, or Firm*—Knobbe, Martens, Olson & Bear, LLP.

(57) ABSTRACT

An apparatus for depositing thin films onto a substrate is provided. The apparatus includes a gas exchange plate that is positioned within a reaction chamber having a platform. The gas exchange plate may be positioned above or below the platform and comprises a first plurality of passages and a second plurality of passages machined therein. The first plurality of passages is in fluid communication with a first reactant source and a purge gas source. Similarly, the second plurality of passages is in fluid communication with a second reactant source and a purge gas source. The first and the second plurality of passages are fluidly connected to first and second plurality of apertures that open to the reaction chamber. Gases are removed from the reaction space through third plurality of apertures within the gas exchange plate that are in fluid communication with exhaust space. Methods of atomic layer deposition (ALD) include exhausting gas through the plane of a gas injection system, pressure fluctuation using multiple pulse precursor and purge steps, and use of booster inert gas flows.

33 Claims, 12 Drawing Sheets

U.S. PATENT DOCUMENTS

| | | | |
|---|---|---|---|
| 4,358,686 A | 11/1982 | Kinoshita | 259/492.2 |
| 4,522,149 A | 6/1985 | Garbis et al. | 118/725 |
| 4,523,985 A * | 6/1985 | Dimock | 204/298.25 |
| 4,579,618 A | 4/1986 | Celestino | 156/345.44 |
| 4,582,720 A | 4/1986 | Yamazaki | 427/573 |
| 4,590,042 A * | 5/1986 | Drage | 422/186.06 |
| 4,595,484 A | 6/1986 | Giammarco et al. | 204/298.33 |
| 4,597,618 A | 7/1986 | Reimer | 439/374 |
| 4,694,779 A | 9/1987 | Hammond et al. | 118/730 |
| 4,738,748 A | 4/1988 | Kisa | |
| 4,798,165 A | 1/1989 | deBoer et al. | 118/715 |
| 4,851,095 A | 7/1989 | Scobey et al. | 204/192.12 |
| 5,010,842 A * | 4/1991 | Oda et al. | 118/723 ME |
| 5,102,523 A | 4/1992 | Beisswenger et al. | 204/298.33 |
| 5,356,673 A | 10/1994 | Schmitt et al. | 427/446 |
| 5,370,709 A * | 12/1994 | Kobayashi | 29/25.01 |
| 5,422,139 A * | 6/1995 | Fischer | 427/248.1 |
| 5,453,124 A * | 9/1995 | Moslehi et al. | 118/715 |
| 5,500,256 A * | 3/1996 | Watabe | 427/579 |
| 5,542,559 A | 8/1996 | Kawakami et al. | |
| 5,551,982 A | 9/1996 | Anderson et al. | 118/715 |
| 5,595,606 A | 1/1997 | Fujikawa et al. | 118/725 |
| 5,622,606 A * | 4/1997 | Kugler et al. | 204/192.12 |
| 5,624,498 A | 4/1997 | Lee et al. | 118/715 |
| 5,656,123 A | 8/1997 | Salimian et al. | |
| 5,669,975 A | 9/1997 | Ashtiani | 118/723 I |
| 5,674,320 A | 10/1997 | Kordina et al. | 118/500 |
| 5,683,537 A | 11/1997 | Ishii | 186/345.33 |
| 5,685,914 A | 11/1997 | Hills et al. | |
| 5,711,811 A | 1/1998 | Suntola et al. | 118/719 |
| 5,716,453 A | 2/1998 | Chen | 118/715 |
| 5,766,364 A * | 6/1998 | Ishida et al. | 118/725 |
| 5,781,693 A * | 7/1998 | Ballance et al. | 392/416 |
| 5,792,261 A * | 8/1998 | Hama et al. | 118/723 I |
| 5,811,022 A | 9/1998 | Savas et al. | 216/68 |
| 5,884,009 A | 3/1999 | Okase | |
| 5,888,907 A * | 3/1999 | Tomoyasu et al. | 438/714 |
| 5,916,365 A | 6/1999 | Sherman | 117/92 |
| 5,938,333 A * | 8/1999 | Kearney | 366/336 |
| 5,983,906 A | 11/1999 | Zhao et al. | |
| 6,025,013 A * | 2/2000 | Heming et al. | 427/9 |
| 6,042,652 A | 3/2000 | Hyun et al. | 118/719 |
| 6,097,005 A | 8/2000 | Akimoto | |
| 6,111,225 A | 8/2000 | Ohkase et al. | |
| 6,148,761 A * | 11/2000 | Majewski et al. | 118/715 |
| 6,183,565 B1 | 2/2001 | Granneman et al. | |
| 6,184,158 B1 | 2/2001 | Shufflebotham et al. | 438/788 |
| 6,200,389 B1 | 3/2001 | Miller et al. | 118/729 |
| 6,200,893 B1 | 3/2001 | Sneh | 438/685 |
| 6,270,571 B1 | 8/2001 | Iwasaki et al. | 117/88 |
| 6,291,800 B1 * | 9/2001 | Shirakawa et al. | 219/390 |
| 6,305,314 B1 | 10/2001 | Sneh et al. | 118/723 R |
| 6,333,019 B1 * | 12/2001 | Coppens | 423/659 |
| 6,342,277 B1 | 1/2002 | Sherman | 427/562 |
| 6,364,949 B1 | 4/2002 | Or et al. | 118/69 |
| 6,368,987 B1 | 4/2002 | Kopacz et al. | 438/288 |
| 6,399,922 B2 | 6/2002 | Okase et al. | |
| 6,416,822 B1 | 7/2002 | Chiang et al. | 427/561 |
| 6,428,859 B1 | 8/2002 | Chiang et al. | 427/457 |
| 6,435,428 B2 | 8/2002 | Kim et al. | |
| 6,446,573 B2 * | 9/2002 | Hirayama et al. | 118/723 MW |
| 6,478,872 B1 * | 11/2002 | Chae et al. | 117/88 |
| 6,502,530 B1 * | 1/2003 | Turlot et al. | 118/723 E |
| 6,537,418 B1 * | 3/2003 | Muller et al. | 156/345.34 |
| 6,736,408 B2 * | 5/2004 | Olgado et al. | 279/3 |
| 6,890,386 B2 * | 5/2005 | DeDontney et al. | 118/715 |
| 6,921,437 B1 * | 7/2005 | DeDontney et al. | 117/715 |
| 7,273,526 B2 | 9/2007 | Shinriki et al. | |
| 2002/0066411 A1 | 6/2002 | Chiang et al. | 118/724 |
| 2002/0068458 A1 | 6/2002 | Chiang et al. | 438/694 |
| 2002/0092471 A1 * | 7/2002 | Kang et al. | 118/715 |
| 2002/0197402 A1 | 12/2002 | Chiang et al. | 427/255.39 |
| 2003/0143328 A1 | 7/2003 | Chen et al. | |
| 2004/0050325 A1 * | 3/2004 | Samoilov et al. | 118/715 |
| 2004/0050326 A1 * | 3/2004 | Thilderkvist et al. | 117/715 |
| 2004/0142558 A1 | 7/2004 | Granneman | |
| 2004/0216665 A1 * | 11/2004 | Soininen et al. | 118/715 |
| 2004/0221809 A1 * | 11/2004 | Ohmi et al. | 118/715 |
| 2005/0208217 A1 | 9/2005 | Shinriki et al. | |

FOREIGN PATENT DOCUMENTS

| | | | |
|---|---|---|---|
| EP | 0 550 058 A2 | 7/1993 | |
| JP | 61-101020 A | 5/1986 | |
| JP | 61-263118 A | 11/1986 | |
| JP | 61-294812 | 12/1986 | |
| JP | 62-021237 | 1/1987 | |
| JP | 62-080271 A | 4/1987 | |
| JP | 63-136532 | 6/1988 | |
| JP | 02-030119 | 1/1990 | |
| JP | 02-034915 | 2/1990 | |
| JP | 04-078130 | 3/1992 | |
| JP | 04075328 A * | 3/1992 | |
| JP | 09129555 A * | 5/1997 | |
| JP | 11121381 A * | 4/1999 | |
| JP | 2002121677 A * | 4/2002 | |
| JP | 2003060186 A * | 2/2003 | |
| JP | 2004292872 A * | 10/2004 | |
| WO | WO 96/17106 | 6/1996 | |
| WO | WO 96/17969 | 6/1996 | |
| WO | WO 00/12964 | 3/2000 | |
| WO | WO 00/63957 | 10/2000 | |
| WO | WO 00/79019 A1 | 12/2000 | |
| WO | WO 00/79576 A1 | 12/2000 | |
| WO | WO 01/00680 A1 | 1/2001 | |
| WO | WO 01/17692 A1 | 3/2001 | |
| WO | WO 02/08488 A1 | 1/2002 | |
| WO | WO 02/26192 A2 | 4/2002 | |
| WO | WO 03/023835 A1 | 3/2003 | |

OTHER PUBLICATIONS

Imai et al., "Atomic layer epitaxy of Si using atomic H," *Thin Solid Films*, vol. 225, (1993), pp. 168-172.

Koleske et al., "Atomic layer epitaxy of Si of Ge(100) using $Si_2Cl_6$ and atomic hydrogen," *Appl. Phys. Lett.*, vol. 64, No. 7, Feb. 14, 1994, pp. 884-886.

Mahajan et al., "Si atomic layer epitaxy based on $Si_2H_6$ and remote He plasma bombardment," *Thin Solid Films*, vol. 225, (1993), pp. 177-182.

Singh et al., "Measurement of neutral and ion compositon, neutral temperature, and electron energy distribution function in a $CF_4$ inductively coupled plasma," *J. Vac. Sci Technol. A.*, vol. 19, No. 3, May/Jun. 2001, pp. 718-729.

Singh et al., "Measurements of the electron energy distribution function in molecular gases in a shielded inductively coupled plasma," *Journal of Applied Physics*, vol. 88, No. 7, Oct. 1, 2000, pp. 3889-3898.

Sugahara et al., "Atomic hydrogen-assisted ALE of germanium," *Applied Surface Science*, vol. 90, (1995), pp. 349-356.

Sugahara et al. "Atomic layer epitaxy of germanium," *Applied Surface Science*, vol. 82/83, (1994), pp. 380-386.

Sugahara et al., "Modeling of germanium atomic-layer-epitaxy," *Applied Surface Science*, vol. 122, (1997), pp. 176-186.

* cited by examiner

US 7,601,223 B2

SHOWERHEAD ASSEMBLY AND ALD METHODS

REFERENCE TO RELATED APPLICATION

This application is a continuation-in-part of U.S. patent application Ser. No. 10/428,207, filed Apr. 29, 2003 now U.S. Pat. No. 7,537,662, the disclosure of which is incorporated herein by reference.

FIELD OF THE INVENTION

The present invention relates generally to a semiconductor processing apparatus and more particularly, a semiconductor processing apparatus for depositing thin films on a substrate surface.

BACKGROUND OF THE INVENTION

Thin films may be grown on the surface of substrates by several different methods. These methods include vacuum evaporation deposition, Molecular Beam Epitaxy (MBE), different variants of Chemical Vapor Deposition (CVD) including low-pressure and organometallic CVD and plasma-enhanced CVD, and Atomic Layer Epitaxy (ALE), which has been more recently referred to as Atomic Layer Deposition (ALD) for the deposition of a variety of materials.

In ALD, the sequential introduction of reactant species (e.g., a first precursor and a second precursor) to a substrate, which is located within a reaction chamber, is generally employed. Typically, one of the initial steps of ALD is the adsorption of the first reactant on the active sites of the substrate. If one or more elements of the film being deposited are included in the reactant, it can also be referred to as a precursor. Conditions are such that no more than a monolayer forms so that the process is self-terminating or saturative.

For example, the first reactant or precursor can include ligands that remain on the adsorbed species, which prevents further adsorption. Accordingly, deposition temperatures are maintained above the reactant condensation temperatures and below the reactant thermal decomposition temperatures within the so-called ALD window. This initial step of adsorption is typically followed by a first purging stage, where the excess first reactant and possible reaction byproducts are removed from the reaction chamber.

The second reactant is then introduced into the reaction chamber. The first and second reactants typically react with each other. As such, the adsorbed monolayer of the first reactant reacts instantly with the introduced second reactant thereby producing the desired thin film. This reaction terminates once the adsorbed first reactant has been consumed. The excess of second reactant and possible reaction byproducts are then removed by a second purge stage. The cycle can be repeated to grow the film to a desired thickness. Cycles can also be more complex. For example, the cycles can include three or more reactant pulses separated by purge and/or evacuation steps. Sequential pulses of reactants are separated both temporally and spatially to avoid gas phase reactions.

Ideally, in ALD, the reaction chamber design should not play any role in the composition, uniformity or properties of the film grown on the substrate because the reaction is surface specific. However, rather few reactants exhibit such ideal or near ideal behavior. Factors that may hinder this idealized growth mode can include time-dependent adsorption-desorption phenomena, blocking of the primary reaction through by-products of the primary reaction (e.g., as the by-products are moved in the direction of the flow, reduced growth rate downstream and subsequent non-uniformity may result, such as with the corrosive by-products of surface reaction $TiCl_4$+ $NH_3 \rightarrow TiN$+ by-products, total consumption (i.e., destruction) of the second reactant in an upstream portion of the reactor chamber (e.g., decomposition of the ozone in the hot zone), and uneven adsorption/desorption of the first precursor caused by uneven flow conditions in the reaction chamber.

Cross-reactions between reactants or breakdown reactions of the reactants before reaching the reaction chamber may also pose problems for obtaining uniform thin films. For example, issues have been identified where $TiCl_4$ is contacted with elemental Ti, yielding $TiCl_3$ or $Ti_2Cl_6$ molecules that cause complications during $TiO_2$ or TiN deposition. Additionally, trimethyl aluminum (TMA) has been known to decompose at least partially when delivered into the process chamber via the same pathway as used for some metal chloride reactants.

Such problems have been partially alleviated with the use of a showerhead-type apparatus used to disperse the gases into the reaction space, such as disclosed in U.S. Pat. No. 4,798,165. The showerhead-type apparatus, as found in U.S. Pat. No. 4,798,165, may be positioned above a substrate so that the reactant vapors and purge gases flow through apertures that are located on the showerhead and the gas flow may be directed perpendicular to the substrate. However, in such a configuration, in the course of time the reacted gases may form a film in the apertures and the apertures may become blocked. Such blockage may result in uneven deposition of layers onto the substrate and formation of particles in the showerhead that can contaminate substrates.

A single body injector and deposition chamber has been disclosed in U.S. Pat. No. 6,200,389, where the injector includes a front, back, top, bottom and end surfaces. The injector further includes a first elongated passage formed in the injector and extending between the end surfaces. One of the end surfaces is closed. A chemical delivery line leads to the end of the elongated passage. A distribution channel that extends between the elongated passage and the gas delivery surface is formed in the injector. The gas from the chemical delivery line is intended to flow along the distribution channel out the injector. However, the reaction space sides of channels or passages are especially subject to becoming blocked over time. Additionally, reactant gases cannot reach the entire substrate surface because of a gas flow curtain effect between adjacent injectors. The susceptor or injectors must be moved sideways back and forth during the deposition to reach substrate areas that would otherwise not be exposed to reactant vapors. Need for mechanical movement complicates the deposition method and the construction of the deposition chamber.

Another problem present in the prior art is that, generally, a large distance exists between the reactant in-feed apertures and the exhaust or outlet of the reaction space. For instance, in a typical embodiment wherein a circular outlet is placed around the susceptor plate near the wafer edge and a showerhead plate is placed above the wafer, gases flow from the center of the wafer towards the edge of the wafer. The concentration of reaction byproducts in the gas phase increases towards the edge of the wafer. This becomes increasingly problematic when, for example, hydrogen chloride (HCl) or other corrosive agent is generated as a reaction byproduct. HCl is generated from reactions between metal chlorides and water or between metal chlorides and ammonia and may re-adsorb on the wafer surface and block reactive surface sites. The re-adsorption rate on the surface is a function of the HCl concentration in the gas phase. In such cases the growth rate of the thin film tends to decrease towards the edge of the wafer.

Thus, there is a need for an improved apparatus and method for depositing thin layers that addresses the problems described above.

SUMMARY OF THE INVENTION

In accordance with one aspect of the invention, an apparatus is provided for depositing a thin film on a substrate. The apparatus includes a reaction chamber having a reaction space and a substrate holder for holding the substrate within the reaction space. A gas outlet is in fluid communication with the reaction space. A gas exchange plate having a first side and a second side is positioned within the reaction chamber. A plurality of first passages are machined in the gas exchange plate to be in fluid communication with a first reactant gas source and a purge gas source, as well as communicating with a plurality of first apertures spaced along the first passages. The first apertures open to the reaction space. A plurality of second passages are machined in the gas exchange plate to be in fluid communication with a second reactant gas source and a purge gas source, as well as communicating with a plurality of second apertures spaced along the second passages. The second apertures also open to the reaction space. A plurality of third apertures extend from the first side to the second side of the gas exchange plate, allowing gas to pass therethrough.

In accordance with another aspect of the invention, an apparatus is provided for depositing a thin film on a substrate. The apparatus includes a reaction chamber having a reaction space and a substrate support, disposed within the reaction space. A first plate is positioned above the substrate support, the first plate including a first gas inlet fluidly connected to a first plurality of apertures via a first gas pathway; and a second gas inlet fluidly connected to a second plurality of apertures via a second gas pathway. The first and second pathways are machined into the first plate. The first plate also includes a third plurality of apertures allowing gas to pass through the first plate. A second plate communicates with a gas outlet, positioned above the first plate, where the second plate has a plurality of apertures allowing gas existing between the first plate and the second plate to flow to the gas outlet.

In accordance with another aspect of the invention, a showerhead assembly is provided for a vapor deposition chamber. The assembly includes a gas exchange plate having a thickness between a first side and a second side. The gas exchange plate defines a first network of passages in fluid communication with a first gas inlet and a second network of passages in fluid communication with a second gas inlet. The first and second network of passages include a plurality of first and second apertures opening from the first and second network of passages, respectively, to the second side of the gas exchange plate, where the first and second apertures are interspersed and spaced across the second side of the gas exchange plate. The gas exchange plate also includes a plurality of third apertures extending from the first side to the second side through the thickness of the gas exchange plate, where the third apertures are isolated from the first and second network of passages. The assembly also includes an exhaust plate having a plurality of exhaust apertures therein. The exhaust plate is configured to mate with the gas exchange plate and align the exhaust apertures with the third apertures of the exhaust plate.

In accordance with another aspect of the invention, a showerhead plate is provided with a first side and a second side. The plate has a first flow path through the showerhead plate, including a plurality of first apertures opening to the second side of the showerhead plate. A second flow path through the showerhead plate is isolated from the first flow path within the plate, and includes a plurality of second apertures opening to the second side of the showerhead plate. A plurality of third apertures extends through the showerhead plate, The third apertures are isolated from the first and second flow paths within the showerhead plate.

In accordance with another aspect of the invention, a method of vapor deposition on a substrate housed in a chamber is provided. The method includes injecting vapor phase reactants through a showerhead plate having a plurality of reactant apertures, and exhausting exhaust gases through the showerhead plate.

In accordance with another aspect of the invention, a method of atomic layer deposition includes providing a gas injection system having injection apertures adjacent a substrate support structure in a reaction space. Separate reactant pulses of a plurality of reactants are supplied sequentially through the gas injection system. Gases are exhausted from the reaction space through exhaust paths between the injection apertures of the gas injection system.

Further aspects, features and advantages of the present invention will become apparent from the following description of the preferred embodiments.

BRIEF DESCRIPTION OF THE DRAWINGS

FIG. 1 is a schematic, cross-sectional and exploded side view of an ALD reactor according to an embodiment of the invention.

FIG. 2 depicts a schematic top and side view of the gas exhaust plate presented in FIG. 1.

FIG. 3 depicts a step in the machining of passages to the gas exchange plate presented in FIG. 1.

FIG. 4 depicts a further step in the machining of gas in-feed apertures and exhaust apertures to the gas exchange plate presented in FIG. 1.

FIG. 5 depicts a further step in machining of the gas exchange plate presented in FIG. 1.

FIG. 6 is a schematic cross-section of an exemplary reactant source for liquid reactants in a purge step.

FIG. 7 is a schematic cross-section of another exemplary reactant source for liquid reactants in a pulse step.

FIG. 8 depicts the flow pattern of gases in the deposition reactor during a first reactant pulse.

FIG. 9 depicts the flow pattern of gases in the deposition reactor during an evacuation period.

FIG. 10 depicts the flow pattern of gases in the deposition reactor during a purging step.

FIG. 11 depicts the flow pattern of gases in the deposition reactor during a second reactant pulse.

FIG. 12 is a schematic cross sectional side view of the ALD reactor during a wafer handling step according to an embodiment of the invention.

DETAILED DESCRIPTION OF THE DRAWINGS

While not separately illustrated, the skilled artisan will readily appreciate that the flow sequences described herein can be controlled by a computer through software programming or hardwiring arranged to open and close gas control valves in the desired sequence. Such controls for pulsing reactants and purge gases are well known in the art and not separately illustrated herein.

Figure 1:
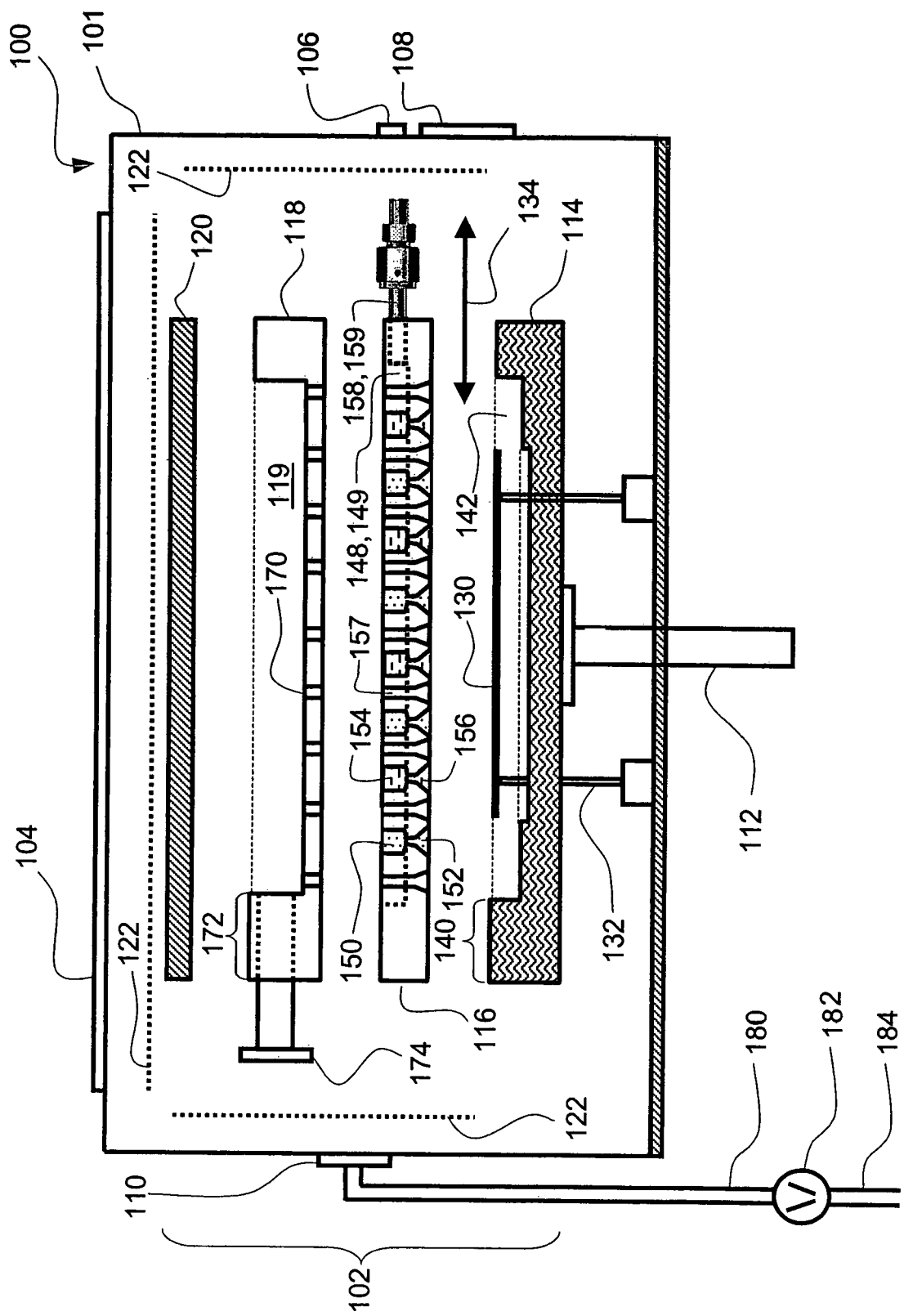
FIGS. 1-12 are non-limiting illustrations (not to scale) of a deposition apparatus and operating method constructed in accordance with various preferred embodiments.

FIG. 1 illustrates a schematic cross-sectional side view of an exploded ALD reactor according to an embodiment of the invention. FIGS. 8-12 show the plates of the showerhead assembly assembled and in operation. The ALD reactor 100 includes a reaction chamber 102 within a vacuum chamber 101. The reaction chamber 102 can be accessed through a service port 104 for assembling and disassembling the reaction chamber 102. Heating elements 122 are placed around the reaction chamber 122 for controlling the temperature of the reaction chamber 102. The reaction chamber 102 consists of a heatable platform or a substrate support plate 114, a gas exchange plate 116, and a showerhead assembly comprising a gas exhaust plate 118 and a top plate 120. Advantageously, the plates 116, 118, 120 together form a showerhead arrangement that provides separated flow paths or channels for the provision of two or more reactants without mixing prior to entering a reaction space, and additionally provide exhaust apertures for reaction by-products and excess reactants. Advantageously, in the illustrated embodiment, the gas exchange plate 116 defines a plurality of apertures for a first reactant, a plurality of apertures for a second reactant, and a plurality of apertures for exhaust. The apertures are interspersed amongst one another within the same plane, arranged for substantially uniform provision of reactants and substantially uniform exhaustion across a substrate.

The substrate support plate 114 is preferably moveable in the vertical direction. When the substrate support plate 114 is lowered, lifting pins 132 rise relative to the support plate 114, and the lifting pin area can be accessed through a gate valve 108 to dispose a wafer or a substrate 130 onto the lifting pins 132 or to replace a processed substrate resting on the lifting pins with a new one. When the substrate support plate 114 is raised, lifting pins 132 lower the substrate 130 onto the substrate support plate 114, sealing surfaces 140 of the substrate support plate 114 are pressed against the gas exchange plate 116, and a reaction space 142 is formed between the substrate support plate 114 and the gas exchange plate 116. Thus, the substrate 130 is located within the reaction space 142 during a deposition process.

The substrate support plate 114 can also be a wafer handler 114 configured to move the wafer in and out of the reaction chamber in the direction indicated by the arrow 134. The wafer handler can be configured to receive the wafer 130 in such a way that the wafer 130 touches the handler itself. Alternatively, the wafer handler can operate on the Bernoulli principle, whereby jets of inactive gas produce a low-pressure zone between the handler and wafer. In a Bernoulli configuration the wafer can be held on top or on the bottom of the handler. If the support is a handler configured to support the substrate upside-down, the showerhead assembly described herein can be simply inverted and placed below the substrate. The handler can thus itself be a robot end effector and can thus be configured to move horizontally as well as vertically, but in the illustrated embodiment is more preferably configured to exchange a wafer with a separate robot end effector when the handler is lowered relative to the reaction chamber 142. While configured in the illustrated embodiments as a vertically movable substrate support to facilitate loading and unloading substrates between depositions, the handler preferably keeps the substrate 130 stationary relative to the gas exchange plate 116 during operation.

In the illustrated reactor 100 of FIG. 1, a gas direction system is provided. The gas direction system includes a gas exchange plate 116, a gas exhaust plate 118 and a top plate 120. The gas exchange plate 116 is situated for example about 10-60 mm above the growth surface of the substrate 130 during a deposition process. Generally, according to a preferred embodiment at least two gas inlets are fluidly connected to appropriately spaced in-feed apertures via a series of passages that have been machined into the gas exchange plate 116. The gas exchange plate 116 supplies at least two precursors, A and B, and inactive purge gas from gas inlets 158, 159 through main (or first and second passages) passages 148, 149 (see also FIGS. 3-5), the distributor passages (or first and second distributor passages) 150, 154 and respective in-feed (or first and second apertures) apertures 152, 156 into the reaction space 142. The in-feed apertures 152, 156 of gas exchange plate 116 face the deposition side of the substrate 130. Further, precursor vapors and inactive purge gas are removed from the reaction space 142 through exhaust apertures 157 of the gas exchange plate 116. The exhaust (or third) apertures 157 are preferably interspersed with the reactant in-feed apertures 152, 156, distributed across the gas exchange plate 116. Thus, the showerhead arrangement defines a gas injection system and the exhaust apertures 157 define a gas exhaust flow path through the gas injection system, among the gas injection apertures 152, 156. U.S. patent application Ser. No. 10/428,207, filed Apr. 29, 2003, incorporated herein by reference and from which priority is claimed, discloses other gas injection structures, formed with spaced tubes rather than showerhead plates, in which the gas exhaust flow path through the plane of and interspersed among the gas injection apertures.

In this illustrated embodiment, the gas exchange plate 116 is located above the substrate 130. A skilled artisan will appreciate that the gas exchange plate 116 may be positioned anywhere adjacent the wafer 130. Preferably, the gas exchange plate is positioned to distribute and intersperse the in-feed apertures 152, 156 across an adjacent plane to the substrate's major surface. The gas exchange plate 116 is preferably readily replaceable, but is arranged to remain fixed relative to reactor walls and preferably also fixed relative to the substrate 130 during deposition, facilitating rapid gas spreading by diffusion and/or pressure gradient across the substrate during each reactant or purge pulse.

The gas exhaust plate 118 is positioned against the gas exchange plate 116 so that main passages 148, 149 and distributor passages 150, 154 (which are formed by surface grooves or recesses in the illustrated embodiment) are sealed against the gas exhaust plate 118 from the top side of the passages. Thus, gases enter the gas exchange plate 116 through the inlets 158, 159 that are connected to the feed-through ports 106 of the vacuum chamber 101 and the gases can exit the gas exchange plate 116 only through the in-feed apertures 152, 156 into the reaction space 142. Gases can exit the reaction space 142 only through the exhaust apertures 157 of the gas exchange plate 116. The exhaust apertures 157 are aligned with corresponding exhaust apertures 170 of the gas exhaust plate 118 so that gases can flow only from the reaction space 142 through the aligned apertures 157, 170 into a gas exhaust space 119 of the gas exhaust plate 118.

Regarding the position of the gas exhaust space 119, when the top plate 120 is pressed against the gas exhaust plate 118 with sealing surfaces 172, a high-conductivity exhaust space 119 is formed between the gas exhaust plate 118 and the top plate 120. The gas exhaust space 119 is in fluid communication with exhaust conduits 174 and it guides the exhaust gases from the exhaust apertures 170 to the exhaust conduits 174 that are attached to an exhaust feed-through port 110 of the vacuum chamber 101, and further to an exhaust line 180 and a vacuum pump 182. The vacuum pump 182 has an outlet or gas outlet 184 for expelling compressed gases from the pump. Alternatively, the exhaust feed-through port 110 can communicate with a venturi for the same effect.

Figure 2:
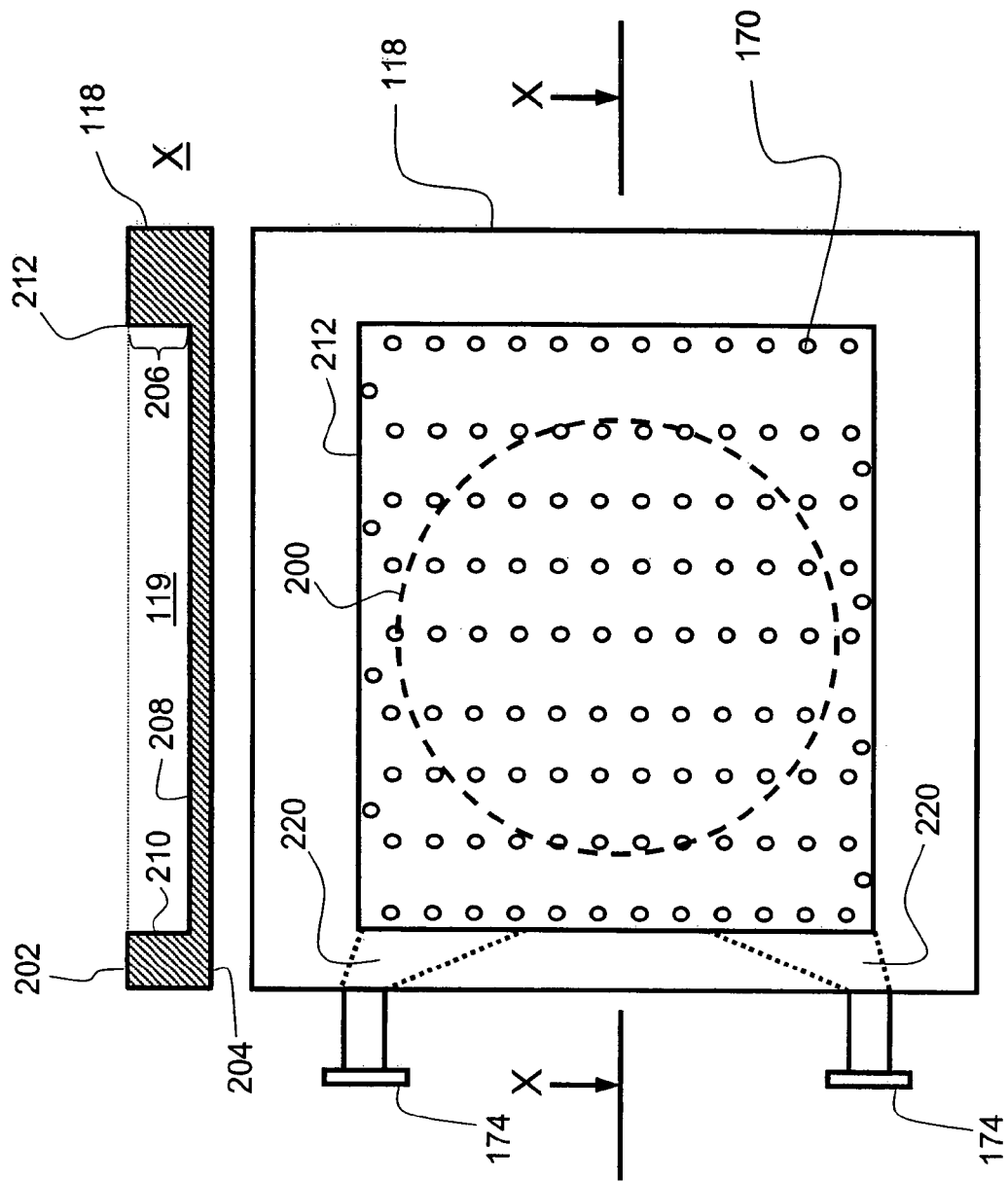

Turning to FIG. 2, a schematic top view of the gas exhaust plate 118 and the exhaust conduits 174 is provided. A dashed circle 200 indicates approximate location of a substrate under the gas exhaust plate 118. The gas exhaust plate 118 includes a top side 202 and a bottom side 204 as shown in the cross section X. The top side 202 includes a hollow having a depth 206 that defines the exhaust space 119. The gas to be exhausted is further directed toward the outlet conduits 220 by a top plate (120 in FIG. 1). The hollow defining the exhaust space 119 comprises a hollow bottom 208 and hollow sidewalls 210 that form a rectangle 212. The hollow bottom 208 includes a plurality of exhaust apertures 170 machined, for example, by drilling through the gas exhaust plate 118.

The exhaust apertures 170 extend from the hollow bottom 208 to the bottom side 204 of the gas exhaust plate 118. The exhaust apertures 170 of the gas exhaust plate 118 are machined to align with the exhaust apertures 157 of the gas exchange plate 116 (FIG. 1). The diameter of the exhaust apertures 157, 170 depends on the required gas flow conductance. Typically the diameter is preferably selected from a range of about 2-10 mm and the exhaust apertures 157, 170 are preferably spaced 5-30 mm from one another. The shape of the cross-section of the exhaust apertures 157, 170 can be for example a circle or a rectangle. Slit-like apertures having narrow rectangle cross-sections can also be provided and they can be made, for example, by laser drilling.

Referring still to FIG. 2, one of the walls 210 of the gas exhaust plate 118 includes outlet conduits 220 that communicate with the exhaust conduits 174. As may be appreciated by one skilled in the art, the exhaust conduits are preferably connected to a vacuum generator that can be a vacuum pump or a venturi. The purpose of the vacuum generator is to create pressure gradient between the reaction space and an outer environment, causing the gas in the reaction space to escape into the outer environment.

Figure 3:
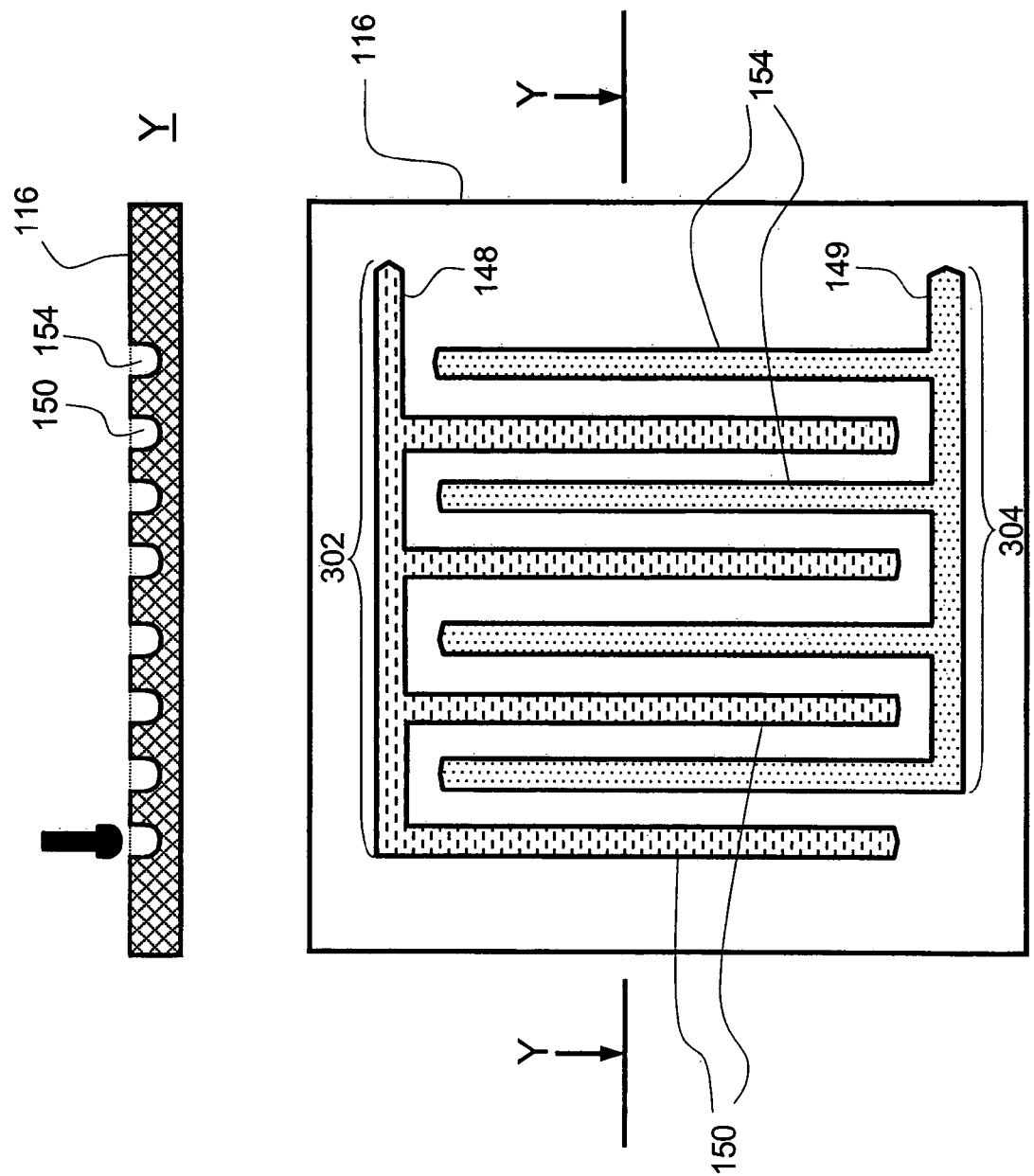
Figure 4:
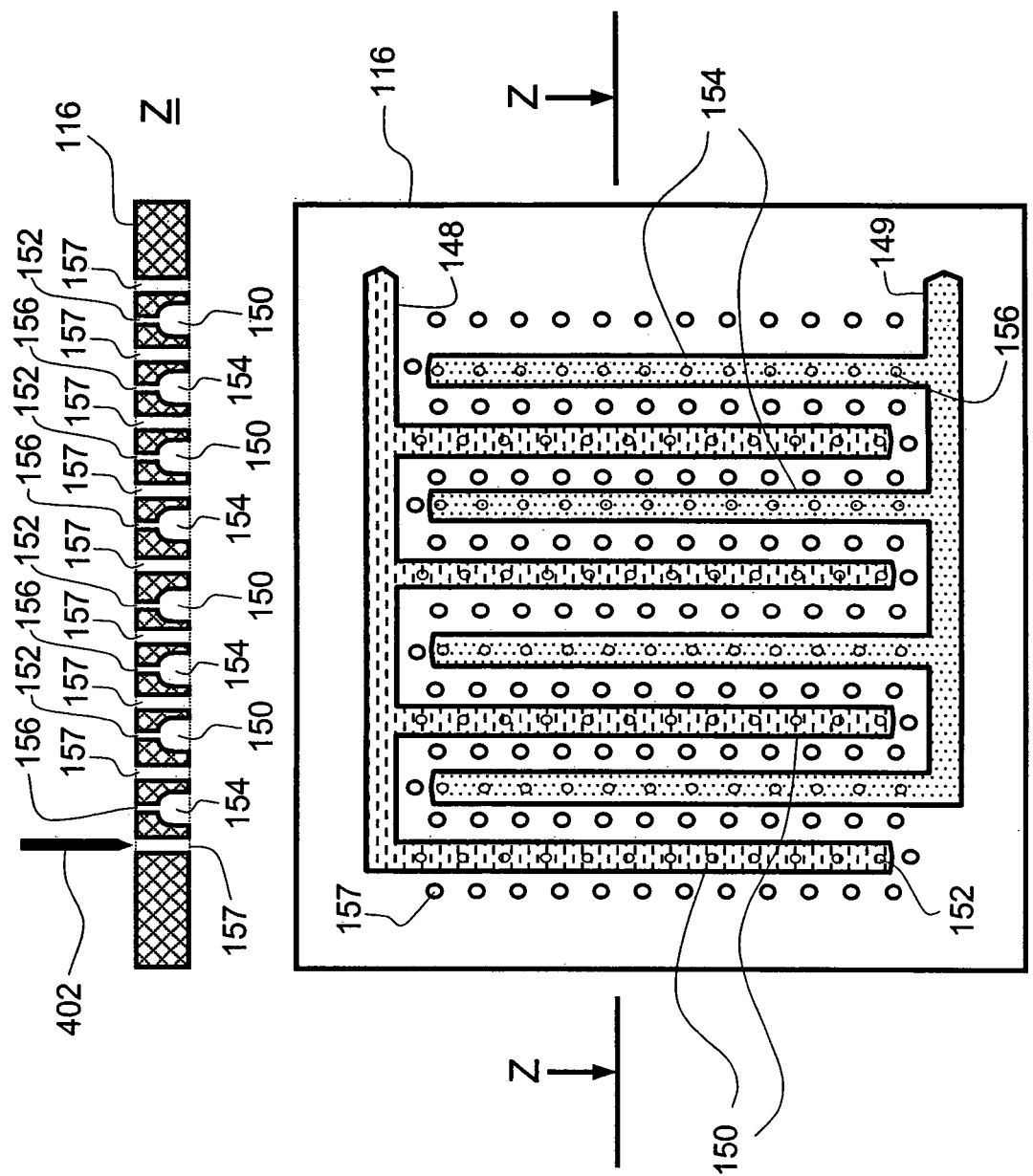
Figure 5:
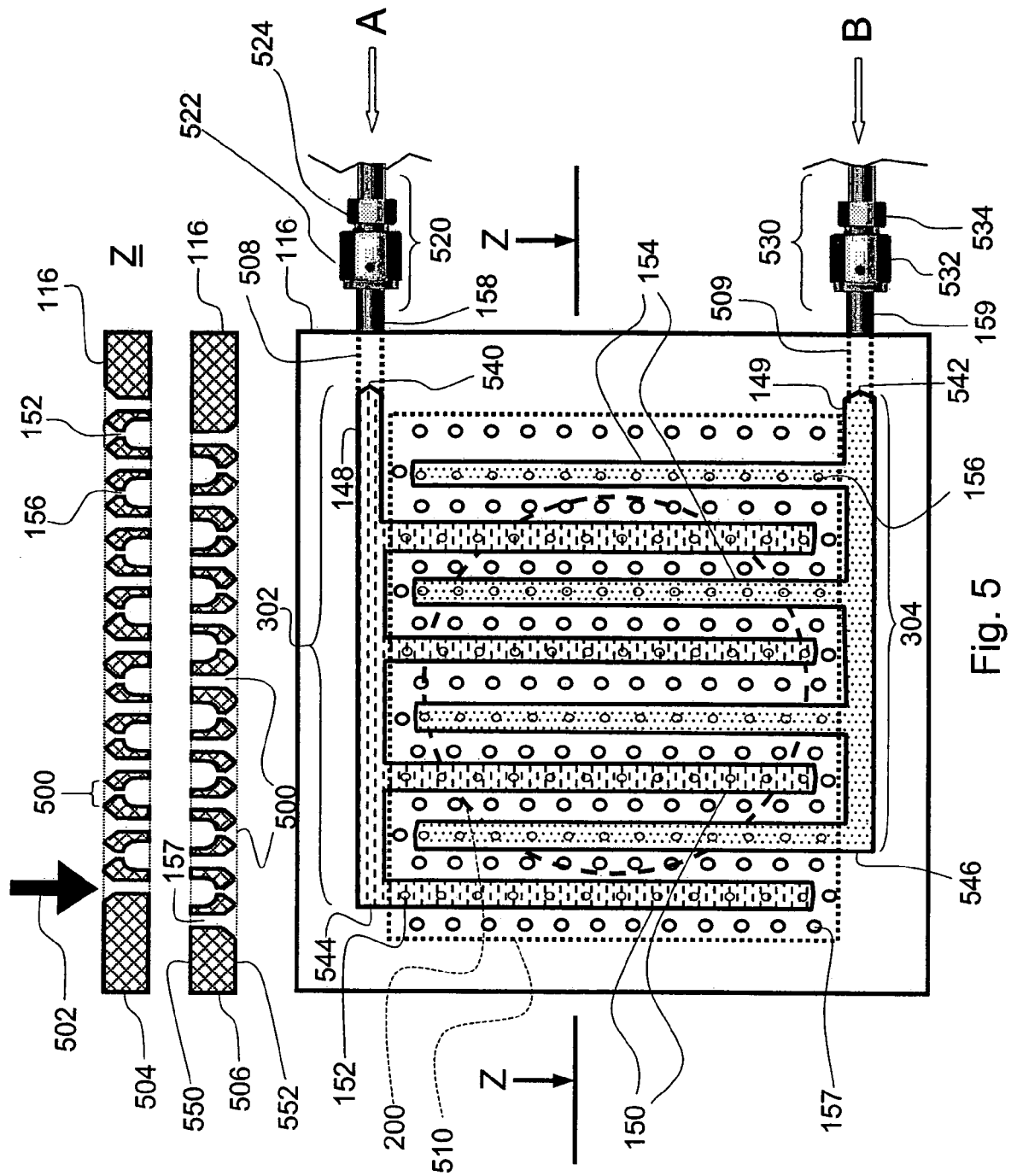

FIGS. 3-5 show an example of how to manufacture the gas exchange plate 116. The gas exchange plate 116 is preferably made of materials that have very smooth surfaces so that the passages and apertures can be purged rapidly. The sealing surfaces may be either smooth or may have some micro roughness (e.g., pebbled surface). Examples of such preferred materials for the plates are glass (especially silica), metals such as aluminum and titanium, electrochemically-polished metal such as nickel, silicon carbide (SiC), polymer, and ceramic- or glass-coated material.

In FIG. 3 two gas flow passage networks having a rake-like shape have been made by machining the gas exchange plate 116. One gas flow rake 302 is provided for reactant A and another gas flow rake 304 is provided for reactant B. The same gas flow rakes 302, 304 are also used for introducing purging gas into the reaction space. In this embodiment, the gas flow rakes 302, 304 consist of series of passages that include the first and second main passage 148, 149 and the distributor passages 150, 154 branching off of the main passages 148, 149. According to one embodiment the corners and the bottom of the gas flow rakes 302, 304 have semi-round shapes as shown in cross section Y, to eliminate stagnant gas flow space related to sharp corners.

While illustrated as including distributor passages 150, 154 branching from main passages 148, 149 within the same plate, it will be understood that, in other arrangements, the passage networks can take other forms. For example, the distributor passages may separately connect to openings of a gas distribution manifold that is integrated with the reaction chamber walls. Alternatively, separate injectors can be provided at the walls for each distribution passage. Each connection can be a tolerance fitting, O-ring seal, axial shaft seal, or any other method of connection known by those skilled in the art. Note also that, while illustrated with each rake or passage network including a single main passage and multiple parallel branching distributor passages, in other arrangements, the passages can have other geometries, as long as suitable distribution of gases across the plate, and therefore, across the substrate, is achieved.

In FIG. 4 a plurality of in-feed apertures 152, 156 and exhaust apertures 157 have been machined, e.g., by drilling 402 through the gas exchange plate 116 within and adjacent to the passages 150, 154. According to another embodiment exhaust apertures 152, 156 comprise slits made, for example, with a laser.

As shown in FIG. 5, according to one embodiment a countersink 500 is machined 502 on a reaction space side 552 of each in-feed and exhaust aperture. The countersink widens the passages and eliminates stagnant flow space near the surface of the gas exchange plate 116. The cross section of the gas exchange plate 116 is shown in a machining position 504 and in a deposition position 506. The approximate position of a wafer under the gas exchange plate 116 is indicated with a dashed circle 200. The extent of the reaction space 142 (FIG. 2) under the gas exchange plate 116 is indicated with a dotted line 510.

Each main passage 148, 149 communicates with a gas inlet 158, 159 and is preferably oriented towards the edge of the gas exchange plate 116. Each main passage 148, 149 extends from a first end 540, 542, respectively, originating at the corner of the gas exchange plate 116 and is machined to linearly extend toward the opposite edge of the gas exchange plate 116, terminating at a second end 544, 546.

Each main passage 148, 149 preferably spans at least the diameter of the substrate or wafer 200 positioned under the gas exchange plate 116. Each distributor passage 150, 154 is machined into the gas exchange plate 116 from one main passage 148 or 149 almost to the other main passage 149 or 148 so that the distributor passages 150, 154 cover at least the diameter of the substrate 200.

The apertures 152, 156 are appropriately spaced (preferably about 3-60 mm, more preferably 5-30 mm apart) along the distributor passages 150, 154 and allow gas to be guided out of the gas exchange plate 116 and onto the substrate 200 under the gas exchange plate 116. In this embodiment, four distributor passages are shown for each main passage; however, more or fewer distributor passages may be machined into the gas exchange plate so long as even distribution of gas over the substrate may still be achieved.

Also machined within the gas exchange plate 116 is the plurality of exhaust apertures 157. The exhaust apertures 157 extend from the first (passage) side 550 of the gas exchange plate 116 to the second (reaction space) side 552, allowing gas to travel from one side of the gas exchange plate 116 to the other. As shown in FIG. 5, the exhaust apertures 157 are interspersed with the distributor passages 150, 154 on the gas exchange plate 116 at positions where neither the main passages 148, 149 nor the distributor passages 150, 154 reside, such that the exhaust apertures 157 are isolated from the gas flow paths (or first and second flow paths) defined by the passages 148, 149, 150, 154 and the in-feed apertures 152, 156. One of the benefits related to such an arrangement is that any gas leak from the distributor passages 150, 154 in the horizontal direction on the top side 550 is consumed by nearby exhaust apertures 157, so that the gas flow rakes or passage networks 302, 304 are effectively isolated from each other. Thus, the description herein of the apertures 152, 156, 157 being "isolated" from one another does not exclude indirect communication of leaked gases, e.g., from imperfect sealing of the gas exhaust plate 118 over the surface groove passages of the gas exchange plate 116.

Next, holes or bores 508, 509 for attaching the gas inlets 158, 159 are drilled into the side of the gas exchange plate 116. After these machining steps it is beneficial to planarize or polish both sides of the gas exchange plate 116 so that it can be sealed tightly against the substrate support plate (114 in FIG. 1) and the gas exhaust plate (118 in FIG. 1).

During assembly, the gas inlets 158, 159 are for example welded or tolerance-fitted to the gas exchange plate 116. The gas inlets 158, 159 have for example a VCR connector 520, 530 that consists of a female nut 522, 532 and a male nut 524, 534 that press a metal gasket between two glands. However, as may be appreciated by a skilled artisan, the gas inlets 158, 159 may be connected by any one of numerous other ways, such as via a single tube or multiple tubes, where each connection can be a tolerance fitting, o-ring seal, an axial shaft seal, or any other method of connection known by those skilled in the art.

Figure 6:
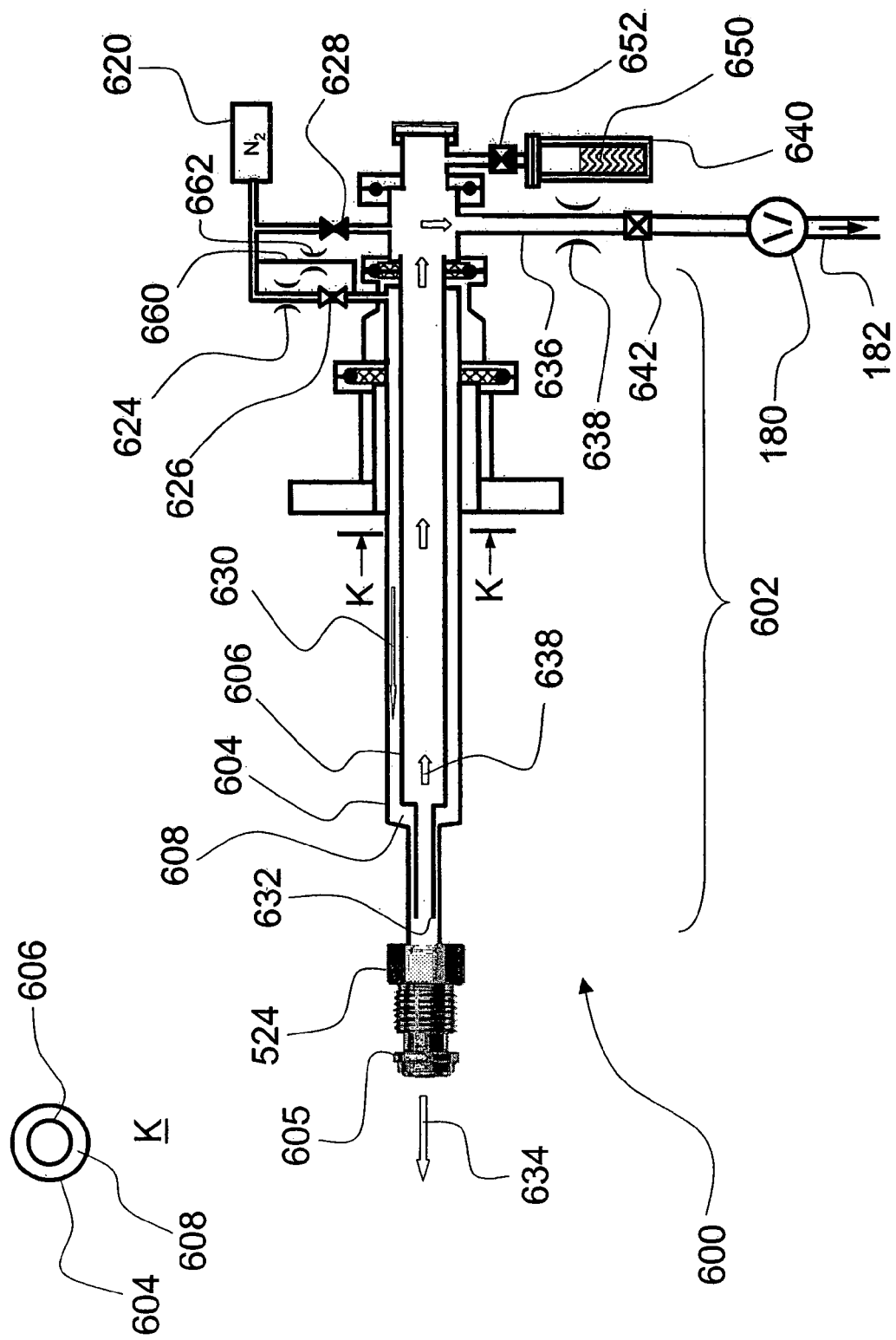

Turning to FIG. 6, a schematic side view of an exemplary first reactant source system 600 is provided depicting the gas flow pattern during a purging step. The first source system 600 may contain gaseous, liquid or solid reactant. The source system 600 contains a first gas feeder 602 that is in fluid communication with the gas flow rake (302 in FIG. 5) of the gas exchange plate (116 in FIG. 5), an inactive gas source 620, a reactant source 640 holding reactant or precursor 650, and a vacuum pump 180. The gas feeder 602 has an outer tube 604 and an inner tube 606 in coaxial arrangement as shown with the inset cross section K. The tip of the outer tube 604 has a VCR connector consisting of a gland 605 and a male nut 524 for attaching to the corresponding female nut (522 in FIG. 5).

The inactive gas source 620 preferably contains inert or noble gas, such as nitrogen or argon. The inactive gas may be used to transport the first and/or second reactant from the reactant source 640 to the reaction space. The inactive gas may also be used to purge the reaction space and/or the gas flow passages of excess reactant and reaction by-product gases. The flow of the precursor vapor and purge gas from the reactant source system 600 through the gas exchange plate 116 to the reaction space 142 and to the vacuum pump 180 will be further detailed below.

An advantage of the gas exchange plate (116 in FIG. 1) is that it enables uniform and rapid deposition of a thin layer onto a substrate 130 inside a reaction space 142. To achieve this, a purge control valve 626 and a source exhaust valve 642 are closed, a booster valve 628 stays closed and a source control valve 652 is opened. As a result, a gas diffusion barrier near the tip 632 is destroyed and the first reactant A vapor travels from the first reactant A supply source 640 through the first inner tube 606 and the section of a first outer tube 604 downstream of the tip 632, through the first main passage 148 (FIG. 5), through the plurality of the distributor passages 150 and out through the plurality of in-feed apertures 152 into the reaction space 142 so that substrate 130 is exposed to the first reactant A vapor and the first reactant A molecules chemisorb onto the substrate 130. Preferably, a monolayer (single molecular layer) or less of the first reactant A molecules chemisorbs on the substrate 130 surface. In cases where the vapor pressure of the precursor is so low that the reactant vapor itself cannot come out of the reactant source 640, an inert carrier gas line (not shown) can be connected to the source 640 so that a pressure increase inside the source 640 forces reactant vapor out of the source 640 to the first inner tube 606. The level of reactant 650 inside the source 640 is measured or estimated to avoid depletion of the reactant 650.

During the first reactant A flow, a small amount of purge gas can simultaneously flow in a space 608 between the first inner tube 606 and the first outer tube 604 towards the gas exchange plate 116, allowing the upstream section of the first outer tube 604 tubing to remain substantially free from first reactant A. Because the purge control valve 626 is closed, a by-pass capillary line 660 restricts with a flow restrictor 662 the flow of the inert gas to a sufficiently low level so that a diffusion barrier is not created near the tip 632 of the first inner tube 606. The space 608 thus serves as a first purge channel while the first inner tube 606 provides a first reactant channel that is preferably less restrictive than the first purge channel. The flow rate of the purge gas during the first reactant A flow can be, for example, about 5% to 20% of the flow rate of the purge gas during the following purge step.

Once the desired chemisorption reaction on the substrate 130 surface has essentially self-terminated through consumption of available reactive surface sites, the source control valve 652 is closed, and the first reactant A supply source 640 is no longer in fluid communication with the reaction space 142. Pressure in the reaction space 142 drops to a low value. The passages by which the gases travel are preferably hermetically sealed. For purposes of the present disclosure, "hermetically sealed" means that all the gas passage surfaces upstream of the reaction space are exposed to only one precursor. Thus, the first gas inlet and the second gas inlet are preferably physically isolated from each other.

Next an optional booster step is activated. The booster valve 628 is opened and inactive gas flows from the inactive gas supply source 620 through the first inner tube 606 towards the gas distributor plate, as indicated with arrow 634. Pressure in the reaction space 142 jumps to a high level. After that the booster valve 628 is closed and the pressure of the reaction space 142 drops to a low level. The booster step clears the first inner tube 606 of the first reactant A vapor. The booster step can be repeated for example 1-3 times after each reactant pulse.

Then a purging step is activated. The purge control valve 626 and source exhaust valve 642 are opened. As a result, a gas diffusion barrier is created near the tip 632 of the first inner tube 606. Purging gas flows from the inactive gas supply source 620 first through the space 608 between the first inner tube 606 and the first outer tube 604 as indicated by arrow 630. Near the tip 632 of the first inner tube 606 the purging gas flow is divided into two parts so that a major part (about 90%) flows to the first main passage 148 (FIG. 5) and distributor passages 150 and through the apertures 152 into the reaction space 142. The excess first reactant A and possible reaction by-products are removed, e.g., purged from the reaction space 142. A minor part (about 10%) of the purging gas flow enters the first inner tube 606 near the tip 632 and goes backwards to the source exhaust 636 and the vacuum pump 180. The purging step is repeated for example, 1-3 times after each reactant pulse.

Figure 7:
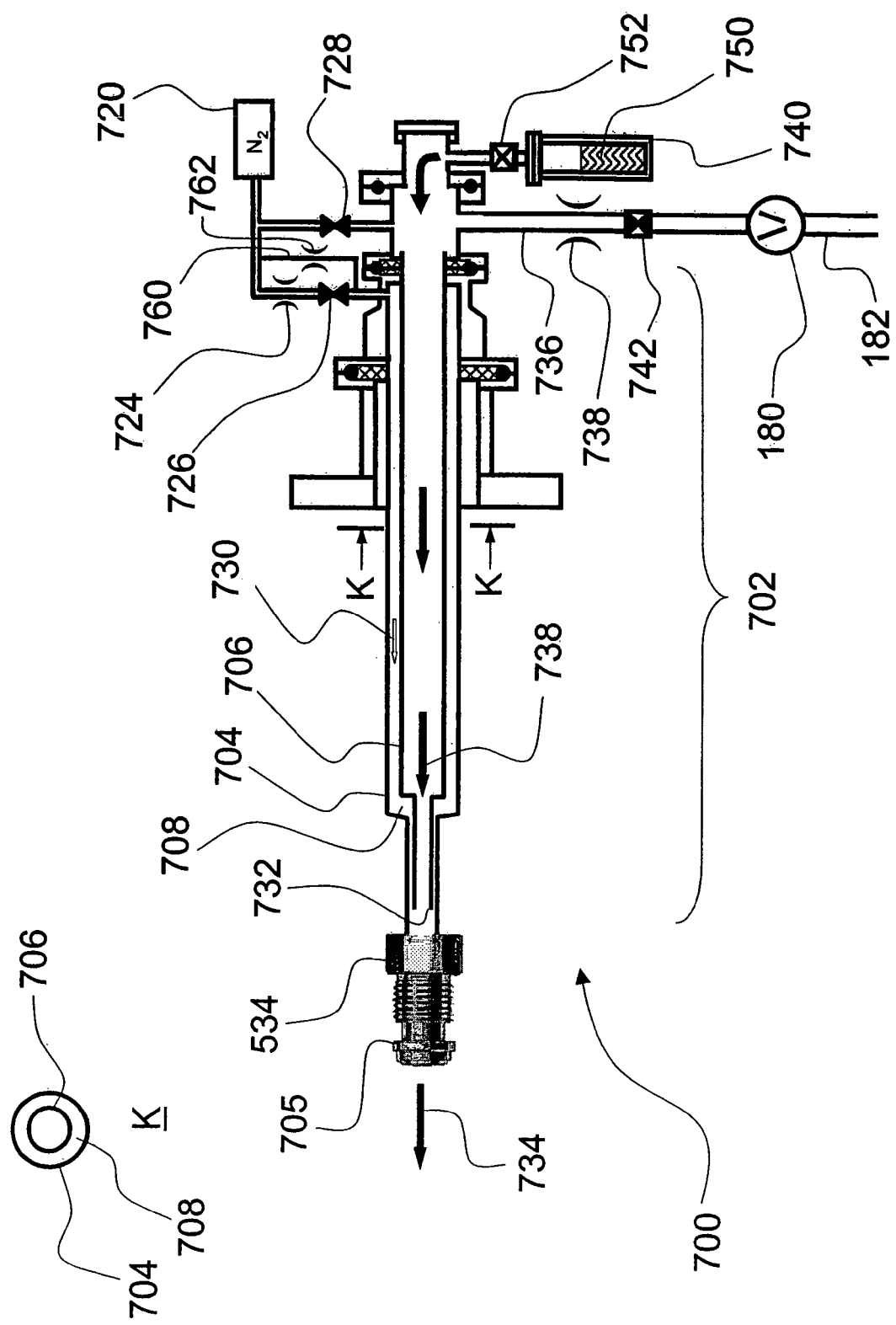

With reference to FIG. 7, the second reactant B vapor is supplied to the reaction space 142 through a second gas inlet or injector 702 that can be similar to the first gas inlet or injector 602. The second gas inlet or injector 702 is in controlled communication with a second reactant B 750, within a second supply source 740, and a purging gas supply source 720. The second gas inlet 702 includes a second inner tube 706 and a second outer tube 704. When reactant vapor is to be injected into the reaction space 142, a purge control valve 726 and a source exhaust valve 742 are closed, a booster valve 728 stays closed, and a source control valve 752 is opened. As a result, second reactant B vapor travels from the second reactant B supply source 740, first through the second inner tube 706, then through the second main passage 149 (FIG. 5) and the second distributor passages 154 and through the plurality of in-feed apertures 156 into the reaction space 142.

Typically, in ALD the second reactant B molecules or radicals will react with the chemisorbed first reactant A that is already present on the substrate 130 surface. During the second reactant B flow, a small amount of purge gas can simultaneously flow as indicated with arrow 730 in a space 708 between the second inner tube 706 and the second outer tube 704 towards the reaction space 142 allowing the upstream section of the second outer tube 704 to remain substantially free from second precursor B. Because the purge control valve 726 is closed, a by-pass capillary line 760 restricts with a flow restrictor 762 the flow of the inert gas to a sufficiently low level so that a diffusion barrier is not created near the tip 732 of the second inner tube 706. The space 708 thus serves as a second purge flow channel while the second inner tube 706 serves as a second reactant flow channel that is preferably less restrictive than the second purge flow channel. The flow rate of the purge gas during the second reactant B flow can be, for example, about 5-20% of the flow rate of the purge gas during the following purge step.

Once the desired reaction with the adsorbed first reactant on the substrate 130 surface has essentially self-terminated through consumption of available reactive surface sites, the source control valve 752 is closed, and the second reactant B supply source 740 is no longer in fluid communication with the reaction space 142. Pressure in the reaction space 142 drops to a low value.

Next an optional booster step is activated. The booster valve 728 is opened and inactive gas flows from inactive gas supply source 720 through the second inner tube 706 towards the gas distributor plate as indicated with an arrow 734. Pressure of the reaction space 142 jumps to a high level. After that the booster valve 728 is closed and the pressure of the reaction space 142 drops to a low level. The booster step clears the second inner tube 706 of the second reactant B vapor. The booster step can be repeated, for example 1-3 times after each reactant pulse.

Then a purging step is activated. The purge control valve 726 and source exhaust valve 742 are opened. As a result, a gas diffusion barrier is created near the tip 732 of the second inner tube 706. Purging gas flows from the inactive gas supply source 720 first through the space 708 between the second inner tube 706 and the second outer tube 704. Near the tip 732 of the second inner tube 706 the purging gas flow is divided into two parts so that a major part (about 90%) flows through the second main passage 149 and distributor passages 154 and through the apertures 156 into the reaction space 142. Any excess second reactant B and possible reaction by-products are removed, e.g., purged from the reaction space 142. A minor part (about 10%) of the purging gas flow enters the second inner tube 706 near the tip 732 and goes backwards to the source exhaust 736.

There are different ways of controlling the gas content of the flow space or purge channel 708 between the first inner tube 706 and the first outer tube 704. According to one embodiment the purge gas valve 726 is kept closed so that gases are stagnant in the purge channel 708 during the pulse time of the reactant. Alternatively, as shown in FIG. 7, the by-pass capillary 760 lets a small amount of inactive gas flow (e.g., 5-20% of the purge flow during a purge step) from the inactive gas source 720 past the closed purge gas valve 726 to the purge channel 708. One benefit of this embodiment is that the inactive gas keeps reactant molecules away from the purge channel 708. The flow rate of the inactive gas is set to such a low level that a gas diffusion barrier is not formed near the tip 732 of the second inner tube 706 and the reactant vapor can flow towards the VCR gland 705. Those skilled in the art will appreciate that other ways to control the gas content in the flow space 708 may also be employed.

Figure 8:
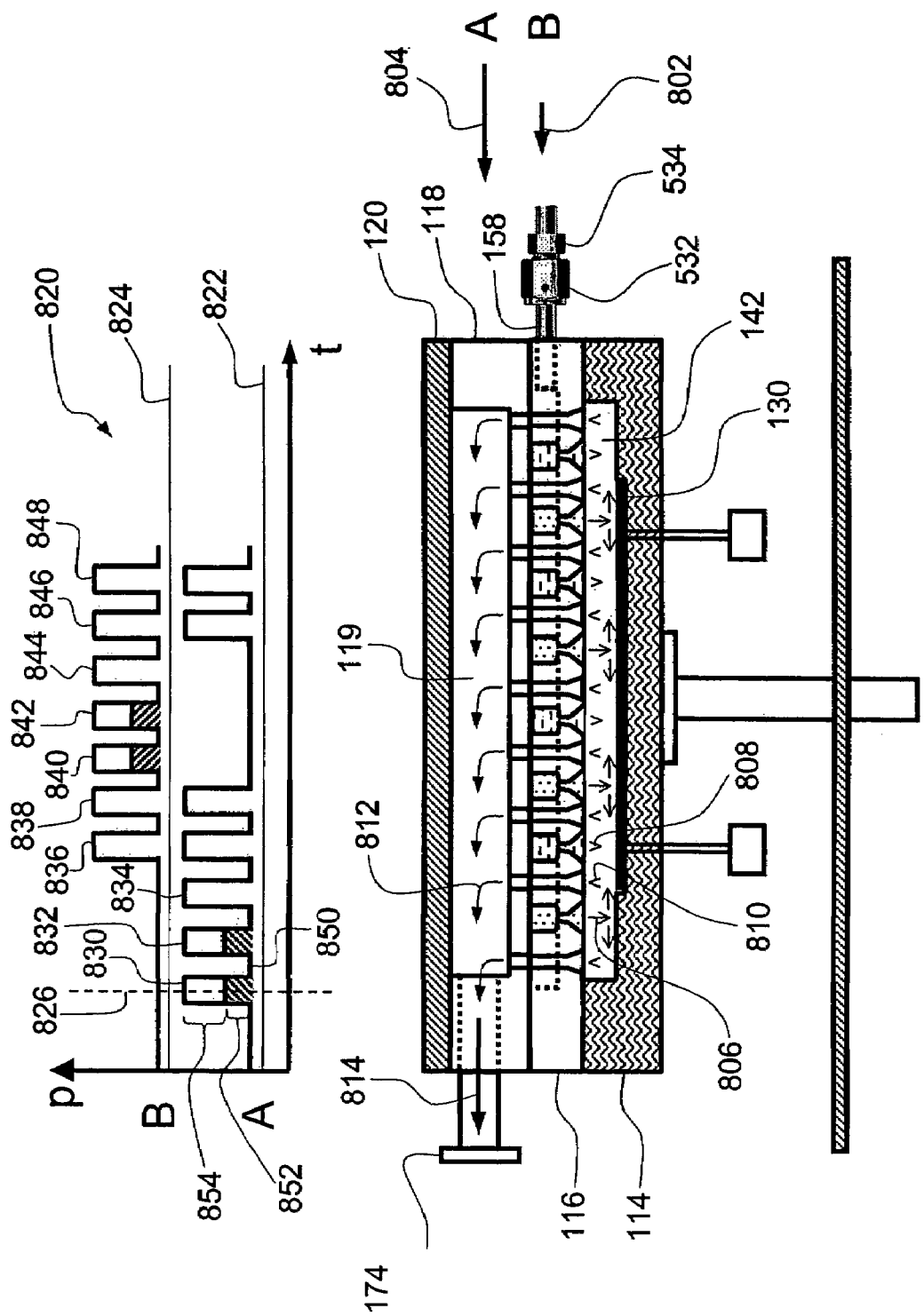

Turning to FIG. 8, a gas flow pattern during the first reactant A pulse is depicted. First reactant A molecules are optionally mixed with inactive carrier gas flow from the A side through the first main passage, corresponding distributor passages, and in-feed apertures into the reaction space 142, as indicated with an arrow 806. At the same time a relatively small amount of inactive gas (e.g., 5-20% of the rate during a purge step) flows from the B side through the second main passage, corresponding distributor passages, and in-feed apertures into the reaction space 142, as indicated with an arrow 808. Gases exit the reaction space 142 through exhaust apertures as indicated by arrows 810. After flowing through the exhaust apertures, exhaust gases are guided through the exhaust space 119 towards the exhaust conduits 174, as indicated with arrows 812, 814.

The timing of gas pulses is shown in the graphic presentation 820 of FIG. 8. The Y-axis represents approximate gas pressures in the distributor passages near the in-feed apertures. The X-axis shows the elapse of time. Zero pressure levels are shown for a gas source A 822 and a gas source B 824. Reference numeral 826 indicates the point of time for the snapshot of the gas flow pattern shown for the reactor. Two gas sources A and B are pulsed according to a certain preferred timing. The pulsing sequence is preferably as follows: pulse A 830, pulse A 832, booster A 834, purge AB 836, purge AB 838, pulse B 840, pulse B 842, booster B 844, purge AB 846 and purge AB 848. Between gas pulses there is a short period of time when the total flow rates from gas sources A and B (including inactive gas) are minimized 850. The total pressure of a reactant pulse consists of the partial pressure of the reactant vapor 852 and the partial pressure of inactive carrier gas 854. It is to be noted that the illustrated embodiments rely on the functioning of gas diffusion barriers near the tip 632, 732 of inner tubes and thus the pressure does not drop to a zero value between pulses.

Figure 9:
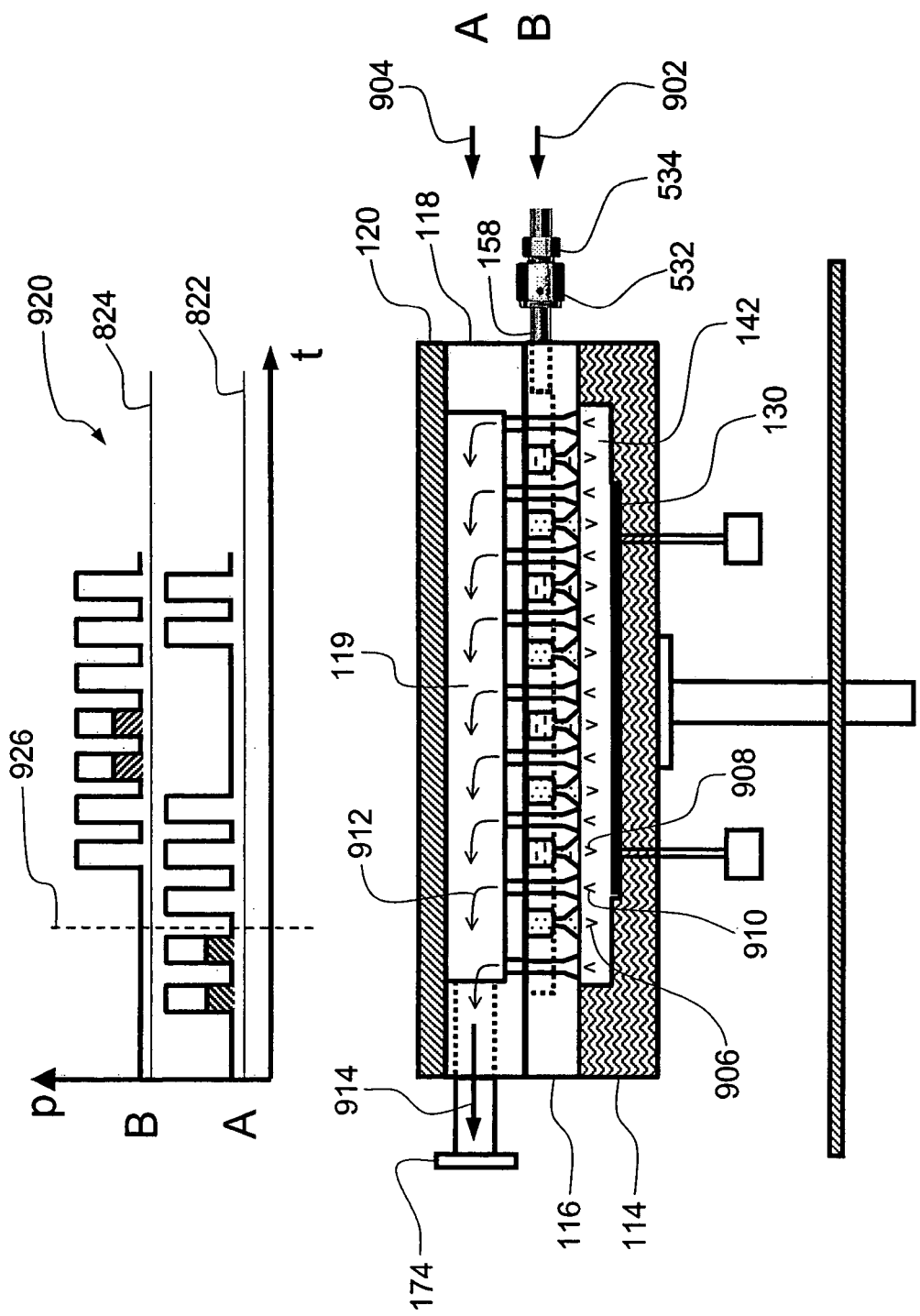

FIG. 9 depicts gas flow pattern after switching off the first reactant A pulse. Inactive gas with a low flow rate comes out of the in-feed apertures of the A side, as indicated with an arrow 906. At the same time inactive gas with a low flow rate comes out of the in-feed apertures of the B side, as indicated with an arrow 908. Gases exit the reaction space 142 through exhaust apertures as indicated with an arrow 910. After passing through the exhaust apertures, exhaust gases are guided through the exhaust space 119 towards the exhaust conduits 174, as indicated with arrows 912, 914. Reference numeral 926 indicates the point of time for the snapshot of the gas flow pattern shown for the reactor.

Figure 10:
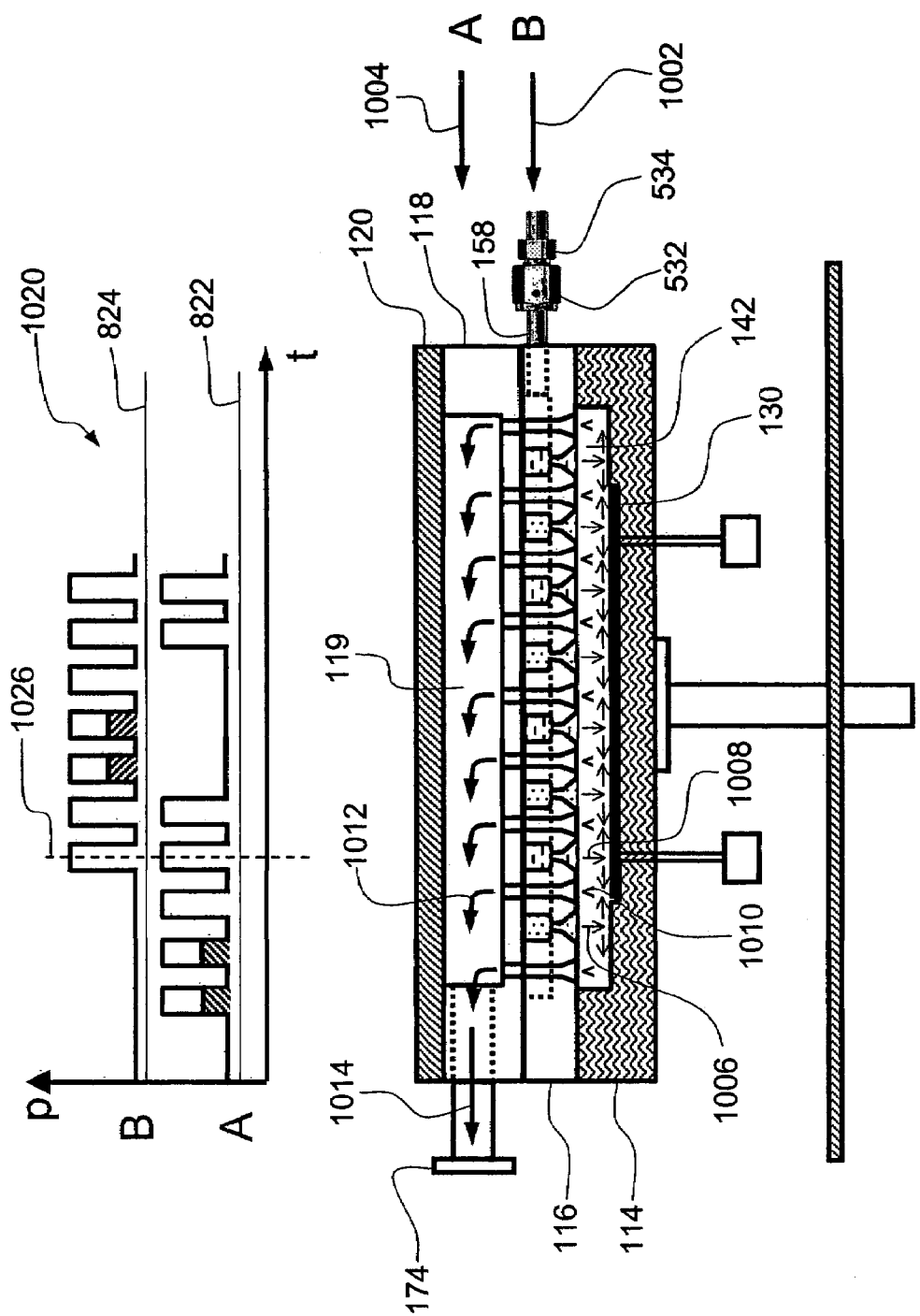

FIG. 10 depicts a gas flow pattern during a purge step. Inactive gas with a high flow rate comes out of the in-feed apertures of the A side, as indicated with an arrow 1006. At the same time inactive gas with a high flow rate comes out of the in-feed apertures of the B side, as indicated with an arrow 1008. Gases exit the reaction space 142 through exhaust apertures, as indicated with an arrow 1010. After passing through the exhaust apertures, exhaust gases are guided through the exhaust space 119 towards the exhaust conduits 174, as indicated with arrows 1012, 1014. Reference numeral 1026 indicates the point of time for the snapshot of the gas flow pattern shown for the reactor.

Figure 11:
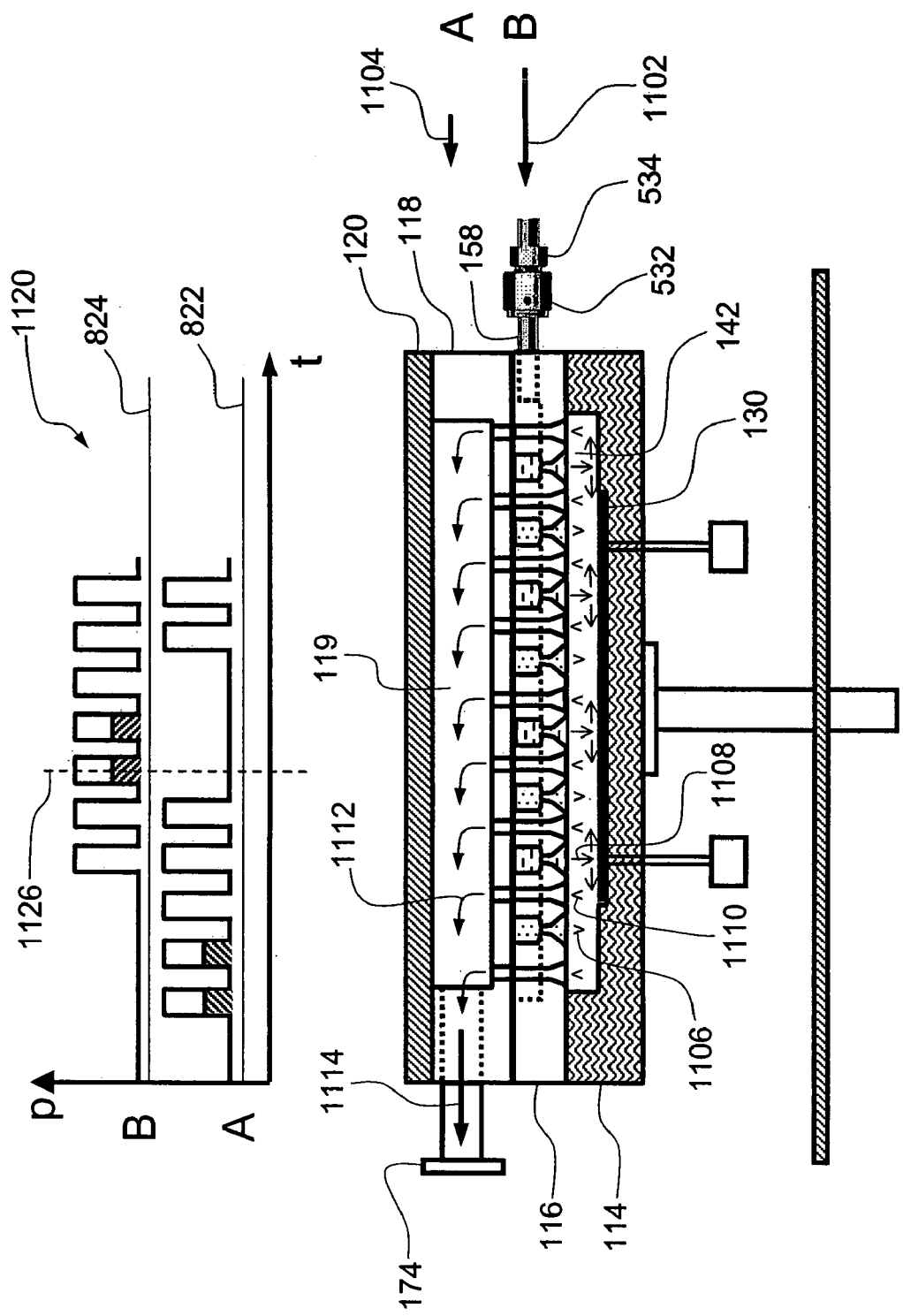

FIG. 11 depicts a gas flow pattern during reactant B pulse. Inactive gas with a low flow rate comes out of the in-feed apertures of the A side, as indicated with an arrow 1106. At the same time reactant B vapor mixed with inactive gas comes of the in-feed apertures of the B side with a high flow rate, as indicated with an arrow 1108. Gases exit the reaction space 142 through exhaust apertures, as indicated with an arrow 1110. After passing through the exhaust apertures, exhaust gases are guided through the exhaust space 119 towards the exhaust conduits 174, as indicated with arrows 1112, 1114. Reference numeral 1126 indicates the point of time for the snapshot of the gas flow pattern shown for the reactor.

Figure 12:
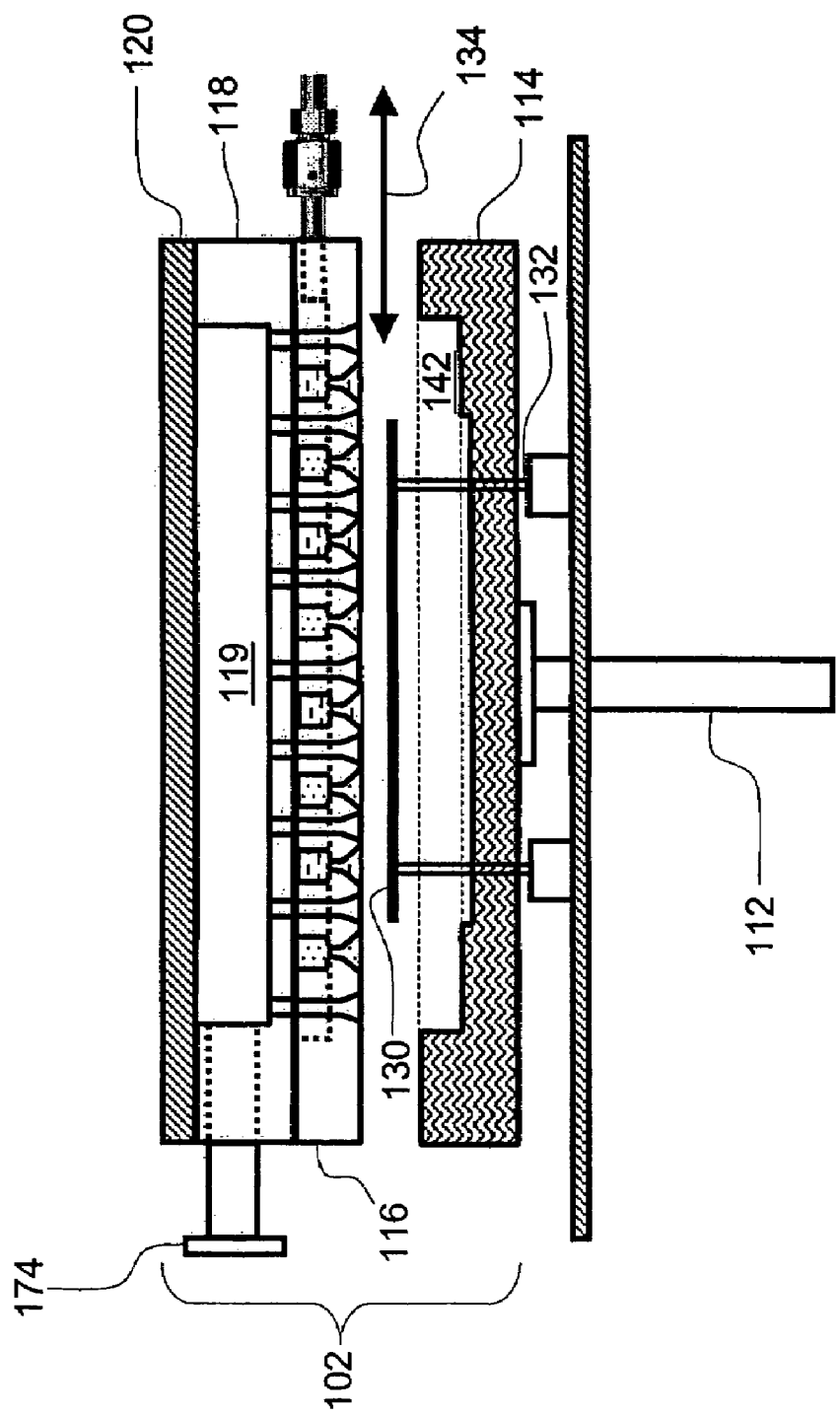

FIG. 12 is a schematic cross sectional side view of the ALD reactor during a wafer-handling step according to an embodiment of the invention. The substrate support plate 114 has been lowered and lifting pins 132 have thus relatively raised the substrate 130 so that it can be accessed and moved in a horizontal direction, as indicated with an arrow 134. After replacing the substrate 130 with a new one, the substrate support plate 114 is raised against the gas exchange or distributor plate 116 so that a reaction space 142 is formed between the plates 114, 116.

The purge gas flow may be modulated by dynamic pressure control of the reaction space. To do so, the reaction space pressure is first kept at a low level, for example, at a pressure range of approximately 0.1-1 mbar. Low reaction space pressure causes faster distribution of the precursor molecules, particularly when the precursor molecules are provided from a higher pressure source, because the diffusion rate of molecules increases.

For dynamic pressure control, the precursor doses are divided into multiple short pulses, which can improve the distribution of the precursor molecules into the reaction chamber. Just before switching on the precursor pulse the pressure of the reaction space is approximately at 0.1-1 mbar. The first short precursor pulse increases the reaction space pressure temporarily to a higher level, for example, at a range of approximately 3-10 mbar. The short precursor pulse lasts for approximately 0.04-0.10 seconds. Then the precursor pulse is switched off for about 0.04-0.50 seconds. Gases flow to the gas outlet and the pressure of the reaction space decreases again to the low level.

The switch-on and switch-off stages are repeated at least two times. As a result, the pressure of the reaction space fluctuates rapidly between the low level and higher level pressure. The resulting pressure gradient in the reaction space during the switch-on stage pushes the precursor molecules efficiently to all areas of the reaction space, while the resulting pressure gradient in the reaction space during the switch-off stage pulls gaseous reaction by-products away from the surfaces of the reaction space to the gas outlet. If a conventional, relatively long pulse (e.g., 1 second) is released to the reaction chamber, the pressure is allowed to equalize, such that dynamic spreading effect is lost and the main part of the gas flow tends to head directly to the gas outlet. When several short pulses (e.g., 3 times 0.3 seconds) are released, a much more even distribution is achieved in a similar time period.

The purge gas flow may also be divided into multiple short pulses that can last for approximately 0.04-0.50 seconds each, preferably between about 2 to 6 pulses per purge step, more preferably between about 2 to 4 pulses per purge step. During the multiple short pulses, pressure in the reaction space fluctuates between the low level and the high level. Switching on the purge flow increases the pressure of the reaction space to the high level, while switching off the purge flow decreases the pressure of the reaction space to low level. The flow rate of the switch-off purge flow may be lowered, for example, to 10% of the switch-on purge flow. In that case the flow rate changes rapidly by one order of magnitude between high flow rate level (e.g., 200 std. $cm^3$/min or sccm) and low flow rate level (e.g., 20 sccm). Pressure gradients inside the reaction space push inactive gas molecules towards the surfaces during the switch-on stage and pull the gas molecules away from the surfaces during the switch-off stage.

Thus, each precursor and purge pulse may consist of multiple switch-on and switch-off stages. Local pressure gradients enhance the exchange of gases in the reaction space and enhance the exchange of molecules between the substrate surface and the gas phase of the reaction space. It has been found that multiple pulses of the same gas per step, whether purge step or reactant step, is particularly advantageous when depositing on wafers with high aspect ratio features, such as deep, narrow trenches or vias in semiconductor substrates. Thus, the process of multiple same-gas pulses in a row, and the consequent pressure fluctuations, are particularly advantageous for deposition inside vias and trenches of greater than 20:1 aspect ratio, and more particularly greater than 40:1 aspect ratio. The pressure fluctuations enable saturation of the surfaces within such vias and trenches in less overall time than a single prolonged pulse. Thus, overall cycle time is reduced.

Additional details regarding the gas injectors (FIGS. 6 and 7) and preferred methods of operation (FIGS. 8-12) can be found in co-owned and copending U.S. patent application Ser. No. 10/428,207, filed Apr. 29, 2003, the disclosure of which is incorporated herein by reference. In particular, additional details regarding the booster step can be seen in ¶ [0058] of the '207 application, and additional details regarding the use of multiple pulse pressure fluctuations and gradients to spread gases, particularly across wafers with high aspect ratio features such as deep trenches and vias, can be found at ¶¶ [0082] and [0087] of the '207 application.

The construction of the ALD reactor and the method of operating the ALD reactor as presented herein produce certain benefits. The gas exchange plate 116 and gas exhaust plate structures 118 of the invention are simple and cheap to manufacture. They may be configured so that they are suitable as consumable items for after sales marketing. For instance, as mentioned above, the gas exchange plate 116 described herein can be attached to a gas channel opening such as with a tolerance fitting, o-ring seal, axial shaft seal, or by any other means known by those skilled in the art. By providing a single plate with passages and apertures machined therein, the gas exchange plate 116 is replaceable and is preferably cleaned or even discarded when deposition buildup results in less than optimal operation. Similarly, the gas exhaust plate structure is also replaceable. When deposition and other unwanted residue builds up in the gas exhaust plate apertures, the customer may replace the used gas exhaust plate with a cleaned one or a new one as well.

Additionally because the gas exchange plate 116 is a replaceable part inside the reaction chamber, the customer can select an exchange plate structure that meets specific needs. For example, the size, the number and the location of the apertures can be optimized so that the whole wafer will be exposed uniformly to the reactant gas. Advantageously, the entire chamber does not require disassembly in order to replace the gas exchange plate; rather, the chamber can simply be opened and the gas exchange plate can be readily replaced with minimal reactor downtime and minimal re-tuning after replacement.

Furthermore, the novel structure of the showerhead assembly disclosed herein accomplishes much of the same functionality and advantages described in U.S. patent application Ser. No. 10/428,207, filed Apr. 29, 2003, but with a more readily assembled and replaced structure, as compared to the multiple tubes disclosed in that application. The same pulsing sequence and ability to exhaust through the same plane of the showerhead as the injection points advantageously lends itself to uniform application of gases, and is less subject to nonuniformities caused by downstream effects from reaction by-products.

While the invention has been described with reference to a preferred embodiment, it will be understood by those skilled in the art that various changes may be made and equivalents may be substituted for elements thereof without departing from the scope of the invention. In addition, many modifications may be made to adapt to a particular situation or material to the teachings of the invention without departing from the essential scope thereof. Therefore, it is intended that the invention is not to be limited to the particular embodiment disclosed as the best mode contemplated for carrying out this invention, but that the invention will include all embodiments falling within the scope of the appended claims.

We claim:

1. An apparatus for depositing a thin film on a substrate, comprising:
    a reaction chamber having a reaction space;
    a substrate holder for holding the substrate within the reaction space;
    a gas outlet in fluid communication with the reaction space;
    a gas exchange plate having a first side and a second side, positioned within the reaction chamber, the plate comprising:
    a plurality of first passages machined therein being in fluid communication with a first reactant gas source and a purge gas source, the first passages communicating with a plurality of first apertures spaced along the first passages, the first apertures opening to the reaction space;
    a plurality of second passages machined therein being in fluid communication with a second reactant gas source and a purge gas source, the second passages communicating with a plurality of second apertures spaced along the second passages, the second apertures opening to the reaction space; and
    a plurality of third apertures extending from the first side to the second side of the gas exchange plate, allowing gas to pass therethrough.

2. The apparatus of claim 1, wherein:
    the first passages include a first main passage connected to a plurality of first distributor passages; and
    the second passages include a second main passage connected to a plurality of second distributor passages.

3. The apparatus of claim 2, wherein the first main passage is formed along a first side of the gas exchange plate and the second main passage extends parallel to the first main passage along an opposite side of the gas exchange plate.

4. The apparatus of claim 3, wherein the first distributor passages extend parallel to the second distributor passages and extend perpendicularly from the first and second main passages, respectively.

5. The apparatus of claim 4, wherein the first distributor passages alternate with the second distributor passages along an axis parallel to the first and second main passages.

6. The apparatus of claim 1, further comprising an exhaust plate having a first side and a second side, the second side of the exhaust plate being flush with the first side of the gas exchange plate.

7. The apparatus of claim 6, wherein the gas exhaust plate includes a plurality of exhaust apertures aligned with the plurality of third apertures of the gas exchange plate.

8. The, apparatus of claim 7, wherein the first and second passages comprise grooves on the first side of the gas exchange plate, the exhaust plate overlying and sealing the grooves to enclose the first and second passages.

9. The apparatus of claim 7, wherein the exhaust plate includes a recess defined in the first side of the exhaust plate and an exhaust conduit communicating from the recess to an edge of the exhaust plate.

10. The apparatus of claim 9, further comprising a top plate having a first side and a second side, the second side of the top plate fitting with and sealing against the first side of the exhaust plate, thereby sealing and defining an exhaust space within the recess of the exhaust plate.

11. The apparatus of claim 1, wherein the first, second and third apertures are interspersed with one another and substantially uniformly distributed across the gas exchange plate to provide gas flow substantially uniformly across the substrate holder.

12. The apparatus of claim 1, wherein the first plurality of apertures are distributed along a plurality of parallel lines and the second plurality of apertures are distributed across a plurality of parallel lines alternated with the parallel lines of the first plurality of apertures.

13. The apparatus of claim 1, wherein the substrate holder is an end effector of a wafer handler.

14. The apparatus of claim 1, wherein the substrate holder is a platform comprising a heated susceptor plate.

15. The apparatus of claim 1, wherein the substrate holder holds the substrate in place by operation of the Bernoulli principle.

16. The apparatus of claim 1, wherein the gas exchange plate is positioned below the substrate holder.

17. The apparatus of claim 16, wherein the substrate holder is a vacuum chuck.

18. The apparatus in claim 1, wherein the gas outlet is fluidly connected to a vacuum.

19. The apparatus in claim 1, wherein the gas outlet communicates with a venturi.

20. The apparatus of claim 1, further comprising controls for alternately providing first reactant to the first plurality of passages while stopping second reactant flow to the second plurality of passages and providing second reactant to the second plurality of passages while stopping first reactant flow to the first plurality of passages.

21. The apparatus of claim 1, wherein the first and second plurality of passages comprise open grooves on the first side of the gas exchange plate.

22. The apparatus of claim 21, wherein the grooves comprise rounded bottoms.

23. The apparatus of claim 21, further comprising first and second holes through an edge of the gas exchange plate, the first and second holes communicating with the grooves of the first and second passages, respectively.

24. The apparatus of claim 1, wherein the first and second apertures further comprise countersinks widening the first and second apertures at the second side of the gas exchange plate.

25. The apparatus of claim 24, further comprising countersinks widening the third apertures at the second side of the gas exchange plate.

26. An apparatus for depositing a thin film on a substrate, comprising:
    a reaction chamber having a reaction space;
    a substrate support, disposed within the reaction space;
    a first plate positioned above the substrate support, the first plate having:
    a first gas inlet fluidly connected to a first plurality of apertures via a first gas pathway;

a second gas inlet fluidly connected to a second plurality of apertures via a second gas pathway, wherein the first and second pathways are machined into the first plate;

a third plurality of apertures allowing gas to pass through the first plate; and a second plate fixed to a gas outlet, positioned above the first plate, having a plurality of apertures allowing gas existing between the first plate and the second plate to flow to the gas outlet.

27. A showerhead assembly for a vapor deposition chamber, comprising:

a gas exchange plate having a thickness between a first side and a second side, the gas exchange plate defining a first network of passages in fluid communication with a first gas inlet and a second network of passages in fluid communication with a second gas inlet, the first and second network of passages including a plurality of first and second apertures opening from the first and second network of passages, respectively, to the second side of the gas exchange plate, the first and second apertures being interspersed and spaced across the second side of the gas exchange plate, the gas exchange plate further including a plurality of third apertures extending from the first side to the second side through the thickness of the gas exchange plate and being isolated from the first and second network of passages; and an exhaust plate having a plurality of exhaust apertures therein, the exhaust plate configured to mate with the gas exchange plate and align the exhaust apertures with the third apertures of the exhaust plate.

28. The showerhead assembly of claim 27, wherein the first and second networks of passages comprise grooves formed in the first side of the gas exchange plate.

29. The showerhead assembly of claim 28, wherein the first and second gas inlets comprise holes machined into an edge of the gas exchange plate and in fluid communication with the first and second network of passages, respectively.

30. The showerhead assembly of claim 28, wherein the exhaust plate has a first side and a second side, the second side of the exhaust plate configured to seal the surface grooves of the first and second network of passages of the gas exchange plate when the second side of the exhaust plate is mated with the first side of the gas exchange plate.

31. The showerhead assembly of claim 30, wherein the exhaust plate further comprises a recess formed in the first side of the exhaust plate, the recess being in communication with each of the exhaust apertures at a bottom of the recess.

32. The showerhead assembly of claim 31, wherein the exhaust plate further comprises outlet conduits extending in fluid communication between the recess and an edge of the exhaust plate.

33. The showerhead assembly of claim 32, further comprising a top plate having a thickness between a first side and a second side, the second side of the top plate configured to mate with and seal against the first side of the exhaust plate, thereby forming an exhaust space within the recess of the exhaust plate.

* * * * *

UNITED STATES PATENT AND TRADEMARK OFFICE
CERTIFICATE OF CORRECTION

PATENT NO.       : 7,601,223 B2                                    Page 1 of 1
APPLICATION NO.  : 10/782727
DATED            : October 13, 2009
INVENTOR(S)      : Lindfors et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 123 days.

Signed and Sealed this

Fifth Day of October, 2010

David J. Kappos
*Director of the United States Patent and Trademark Office*